United States Patent
Kijima et al.

(10) Patent No.: US 12,439,825 B2
(45) Date of Patent: Oct. 7, 2025

(54) FILM STRUCTURE, SINGLE CRYSTAL PIEZOELECTRIC FILM AND SINGLE CRYSTAL SUPERCONDUCTOR FILM

(71) Applicant: I-PEX PIEZO SOLUTIONS INC., Yamaguchi (JP)

(72) Inventors: Takeshi Kijima, Ube (JP); Akio Konishi, Ube (JP)

(73) Assignee: I-PEX PIEZO SOLUTIONS INC., Yamaguchi (JP)

(*) Notice: Subject to any disclaimer, the term of this patent is extended or adjusted under 35 U.S.C. 154(b) by 951 days.

(21) Appl. No.: 17/436,294

(22) PCT Filed: Dec. 27, 2019

(86) PCT No.: PCT/JP2019/051627
§ 371 (c)(1),
(2) Date: Sep. 3, 2021

(87) PCT Pub. No.: WO2020/179210
PCT Pub. Date: Sep. 10, 2020

(65) Prior Publication Data
US 2022/0181541 A1  Jun. 9, 2022

(30) Foreign Application Priority Data

Mar. 7, 2019 (JP) ................. 2019-042068
May 13, 2019 (JP) ................. 2019-090505
Jul. 31, 2019 (JP) ................. 2019-140723

(51) Int. Cl.
*H01L 39/12* (2006.01)
*H01L 41/08* (2006.01)
(Continued)

(52) U.S. Cl.
CPC ......... *H10N 30/708* (2024.05); *H10N 30/853* (2023.02); *H10N 30/8536* (2023.02);
(Continued)

(58) Field of Classification Search
CPC .. H10N 30/708; H10N 30/853; H10N 30/857; H10N 30/8536; H10N 30/8542; H10N 30/8554; H10N 30/8561
(Continued)

(56) References Cited

U.S. PATENT DOCUMENTS 5,753,934 A  5/1998  Yano et al.
5,801,105 A  9/1998  Yano et al.
(Continued)

FOREIGN PATENT DOCUMENTS

CN  103987680  8/2014
CN  110462860  11/2019
(Continued)

OTHER PUBLICATIONS

Goyal et al., "Irradiation-free, columnar defects comprised of self-assembled nanodots and nanorods resulting in strongly enhanced flux-pinning in YBA.SUB.2.CU.SUB.3.0.SUB.7-δ films", Superconductor Science and Technology (2005): 18(11): 1533-1538. (Year: 2005).*

(Continued)

*Primary Examiner* — Emily P Pham
*Assistant Examiner* — Monica Mata
(74) *Attorney, Agent, or Firm* — Wenderoth, Lind & Ponack, L.L.P.

(57) ABSTRACT

According to the present invention, a piezoelectric film having a single crystal structure is able to be formed, from various piezoelectric materials, on a film structure of the present invention. A film structure according to the present invention includes: a substrate; a buffer film which is formed on the substrate and has a tetragonal crystal structure containing zirconia; a metal film containing a platinum group element, which is formed on the buffer film by means of epitaxial growth; and a film containing $Sr(Ti_{1-x}, Ru_x)O_3$ (Continued)

(wherein 0≤x≤1), which is formed on the metal film by means of epitaxial growth.

20 Claims, 33 Drawing Sheets

(51) Int. Cl.
  *H01L 41/187* (2006.01)
  *H10N 30/00* (2023.01)
  *H10N 30/853* (2023.01)
  *H10N 60/85* (2023.01)
(52) U.S. Cl.
  CPC ..... *H10N 30/8542* (2023.02); *H10N 30/8554* (2023.02); *H10N 30/8561* (2023.02); *H10N 60/857* (2023.02)
(58) Field of Classification Search
  USPC .......................................................... 310/358
  See application file for complete search history.

(56) References Cited

U.S. PATENT DOCUMENTS

| | | | |
|---|---|---|---|
| 6,258,459 | B1 | 7/2001 | Noguchi et al. |
| 9,976,219 | B2 | 5/2018 | Kijima et al. |
| 2002/0015852 | A1 | 2/2002 | Noguchi et al. |
| 2004/0259275 | A1 | 12/2004 | Kijima et al. |
| 2006/0012648 | A1* | 1/2006 | Ifuku ................... B41J 2/14233 347/72 |
| 2015/0004762 | A1 | 1/2015 | Shimoda et al. |
| 2018/0114784 | A1 | 4/2018 | Wang |
| 2018/0287037 | A1 | 10/2018 | Maekawa et al. |
| 2020/0381610 | A1 | 12/2020 | Arimoto et al. |
| 2022/0181541 | A1 | 6/2022 | Kijima et al. |

FOREIGN PATENT DOCUMENTS

| | | |
|---|---|---|
| JP | 05-072428 | 3/1993 |
| JP | 09-110592 | 4/1997 |
| JP | 10-287494 | 10/1998 |
| JP | 11-312801 | 11/1999 |
| JP | 2000-256098 | 9/2000 |
| JP | 2002-29894 | 1/2002 |
| JP | 2004-281762 | 10/2004 |
| JP | 2006-105886 | 4/2006 |
| JP | 2007-42949 | 2/2007 |
| JP | 2013-009173 | 1/2013 |
| JP | 2013-168530 | 8/2013 |
| JP | 2018-81974 | 5/2018 |
| JP | 2018-167557 | 11/2018 |
| JP | 2019-042068 | 3/2019 |
| JP | 2019-090505 | 5/2019 |
| JP | 2019-140723 | 7/2019 |
| TW | 201724588 | 7/2017 |
| WO | 2018/216227 | 11/2018 |
| WO | 2020/179210 | 9/2020 |

OTHER PUBLICATIONS

Office Action issued Feb. 13, 2024 in corresponding Japanese Patent Application No. 2021-503431, with English translation.
Extended European Search Report issued Dec. 2, 2022 in European Patent Application No. 19918375.7.
Information offer mailed on May 7, 2024, in Japanese Patent Application No. 2021-503431, with English-language translation.
Office Action issued May 14, 2024, in Japanese Patent Application No. 2021-503431, with English-language translation.
International Search Report issued Mar. 17, 2020, in International (PCT) Application No. PCT/JP2019/051627, with English translation.
Japanese Information offer (No. 1) for Japanese Patent Application No. 2024-113785 issued Dec. 11, 2024, with English language translation.
Japanese Information offer (No. 2) in Japanese Patent Application No. 2024-113785 issued Dec. 11, 2024, with English language translation.
Japanese Information offer (No. 3) in Japanese Patent Application No. 2024-113785 issued Dec. 11, 2024, with English language translation.
The 80th Autumn Academic Lecture of the Japan Society of Applied Physics: Lecture Notes 21p-C309-1 'Piezoelectric Characteristics of PZT Single Crystal Thin Films Using Tetragonal Zirconia,' Presented on Sep. 21, 2019, with partial English translation.
Distribution Materials of the 20th Piezoelectric MEMS Research Meeting: 'Epitaxial Piezoelectric Thin Film Growth Technology on Si Substrate Using T-ZrO2 Buffer Layer,' Presented on Oct. 23, 2019, with partial English language translation.
Japanese Opposition in corresponding Japanese Application No. 2021-503431 of Mar. 12, 2025, with English language summary thereof.
Morita, M., et al., "Growth of crystalline zirconium dioxide films on silicon," Journal of Applied Physics, vol. 58, Issue 6, Sep. 15, 1985, pp. 2407-2409.
Nagakura, Saburo, et al., Iwanami Dictionary of Physics and Chemistry, 5th Edition, 1st Printing, Iwanami Shoten Publishers Co., Ltd., Feb. 20, 1998, p. 273 ("Single Crystal" entry), with English language translation.
Written Opinion of Jun. 7, 2024, in corresponding Japanese Patent Application No. 2021-503431, with English language translation.
Nagakura, Saburo, et al., Iwanami Dictionary of Physics and Chemistry, 5th Edition, 1st Printing, Iwanami Shoten Publishers Co., Ltd., Feb. 20, 1998, p. 191 ("Epitaxy" entry), with English language translation.
Notice of Reasons for Refusal issued May 7, 2025, in corresponding Japanese Patent Application No. 2024-113785, with English language translation.
Decision on Opposition issued Jun. 3, 2025 in Japanese Patent Application No. 2021-503431, with English-language translation.
Information Notice Offer issued Jul. 25, 2025 in corresponding Japanese Patent Application No. 2024-113785, with English language translation.
Notice of the First Examination dated Jul. 9, 2025 in Chinese Patent Application No. 201980093697.2 with English translation.

* cited by examiner

Si220

ZrO$_2$220

Pt220

PZT220

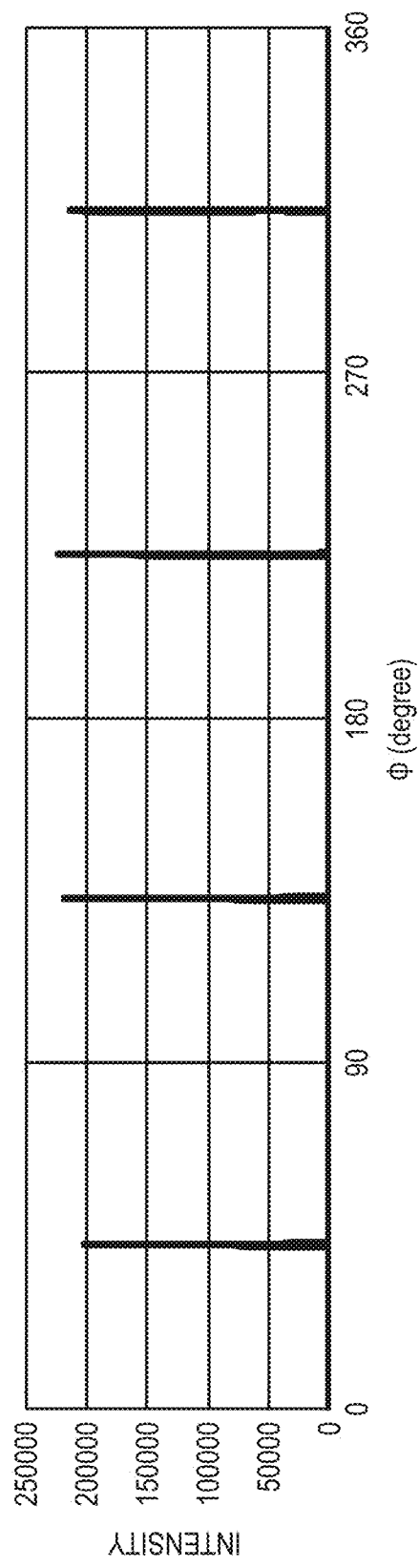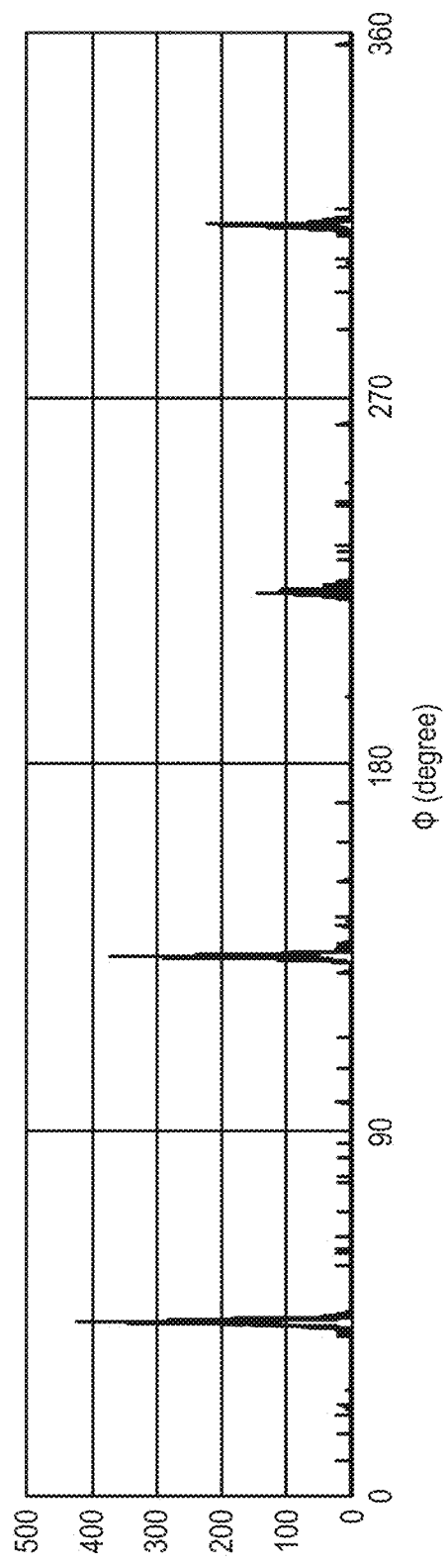

FILM STRUCTURE, SINGLE CRYSTAL PIEZOELECTRIC FILM AND SINGLE CRYSTAL SUPERCONDUCTOR FILM

TECHNICAL FIELD

The present invention relates to a film structure including a buffer film that can form a single crystal piezoelectric film or superconductor film on a substrate by means of epitaxial growth, the piezoelectric film, and the superconductor film.

BACKGROUND ART

At present, in the era of IoT where all kinds of things are connected to Internet, a sensor plays an important role, a market scale thereof is expanded at 20 billion dollars in the entire world and with a market growth rate of 7% to 8%, and 90 billion sensors are produced in the world. Among them, in particular, an effort of an MEMS sensor technology using a piezoelectric material such as PZT is on the market, and the MEMS sensor technology is widely applied to various applications such as a gyro sensor for autonomous driving, a piezoelectric microphone, a high frequency filter for 5G communication, and a vibration power generation element.

With the development of the IoT technology, the MEMS sensor technology using such a piezoelectric material is required to be downsized, thinned, and highly sensitive year by year. On the other hand, although it is necessary to align polarization in order to secure sufficient piezoelectricity to increase the sensitivity, the polarization is not aligned in a piezoelectric material in which a polycrystalline ceramic sintered body is generally used. There is a limit to thinning of the ceramic sintered body. In recent years, attempts have been made to obtain a piezoelectric material as a single crystal of a thin film by means of epitaxial growth (see, for example, Patent Literature 1).

CITATION LIST

Patent Literature

Patent Literature 1: JP-A-5-072428

SUMMARY OF INVENTION

Technical Problem

In an attempt to single-crystallize such a thin film, since most of the piezoelectric material is an oxide, it is difficult to single-crystallize the piezoelectric material by means of epitaxial growth when, for example, a single crystal Si substrate is used. Therefore, for example, an oxide crystal such as yttria-stabilized zirconia (YSZ) may be used as a buffer layer, but the crystal system of the oxide crystal is different from that of the piezoelectric material and the piezoelectric material is affected by a crystal system of the buffer layer at the time of crystal formation of the piezoelectric material. There is a problem that it is difficult to obtain in-plane single crystallinity as a thin film. Since a lattice constant is different for each piezoelectric material, it is necessary to examine a configuration of the buffer layer for each piezoelectric material, and it is difficult to select the buffer layer.

Solution to Problem

In order to solve the above problems, a film structure according to the present invention includes: a substrate; a buffer film formed on the substrate and having a tetragonal crystal structure containing zirconia; a metal film containing a platinum group element and formed on the buffer film by means of epitaxial growth; and a film containing $Sr(Ti_{1-x}, Ru_x)O_3$ ($0 \leq x \leq 1$) and formed on the metal film by means of epitaxial growth.

Advantageous Effects of Invention

According to the present invention, a film having a single crystal structure can be formed from various piezoelectric materials and superconducting materials on a film structure according to the present invention.

BRIEF DESCRIPTION OF DRAWINGS

FIG. 13A shows the substrate 11 of the film structure 101 according to Example 2.

FIG. 13B is a view showing an X-ray diffraction pattern obtained by φ scanning of the piezoelectric film 14.

DESCRIPTION OF EMBODIMENTS

Figure 1:
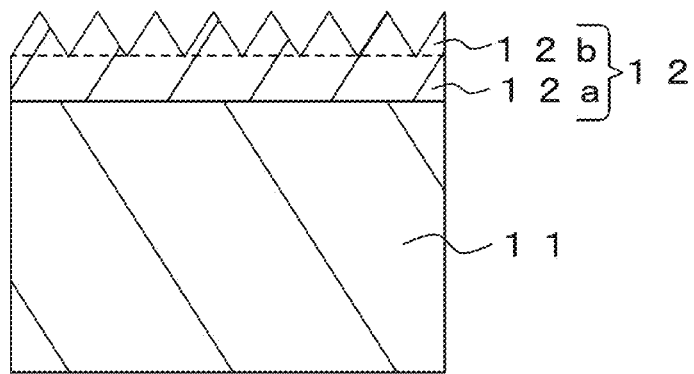
FIG. 1 is a cross-sectional view of a substrate on which a buffer film according to the present invention is formed.

Hereinafter, an embodiment of the present invention will be described with reference to the drawings.

The disclosure is merely an example, and proper changes within the spirit of the invention, which are easily conceivable by those skilled in the art, are included in the scope of the invention as a matter of course. In order to make the description clearer, a width, a thickness, a shape, etc. of each part may be schematically represented as compared with the embodiment, but this is merely an example and does not limit the interpretation of the present invention.

In the specification and the drawings, the same elements as those described in connection with preceding drawings are denoted by the same reference numerals, and a detailed description thereof may be omitted as appropriate.

Further, in the drawings used in the embodiment, hatching (shading) for distinguishing structures may be omitted depending on the drawings.

(Embodiment)

FIG. 1 is a cross-sectional view of a substrate on which a buffer film according to the present invention is formed. As shown in FIG. 1, a buffer film 12 is formed on a substrate 11.

The substrate 11 is, for example, a silicon (Si) substrate. The substrate 11, other than Si, may be, for example, a silicon on insulator (SOI) substrate, a substrate formed of various semiconductor crystals other than Si, a substrate formed of various oxide single crystals such as sapphire, a garnet ($Al_3Fe_2Si_3O_{12}$) substrate, or a glass substrate having a polysilicon film formed on a surface thereof. These substrates may be not only 4-inch substrates but also 6-inch or 8-inch substrates.

An orientation of the substrate 11 may be any orientation, and for example, Si(100), Si(110), Si(111), may be used as long as the substrate is a Si substrate.

The buffer film 12 includes zirconia ($ZrO_2$) which is formed on the substrate 11 by means of epitaxial growth, and includes a film portion 12a and a protruding portion 12b.

ZrO$_2$ is known to cause a phase transition of a crystal system from monoclinic crystal to tetragonal crystal to cubic crystal by an added energy, and in the present invention, the buffer film 12 has a tetragonal crystal structure. The buffer film 12 is preferably formed by means of epitaxial growth in accordance with the orientation of the substrate 11.

It has been reported that the performance of a piezoelectric material is improved when the crystal system thereof is a tetragonal crystal structure or contains the tetragonal crystal structure even when the crystal system is not the tetragonal crystal structure, and it is considered that tetragonal zirconium oxide as a buffer film has an advantageous effect on single crystal formation of the piezoelectric material.

Single crystal ZrO$_2$ contains up to 8% of crystal defects, and it is considered that when there is a crystal defect, atoms close to vacancies of the defect have an elastic force in a direction in which a lattice strain is reduced. It is considered that a degree of the elastic force is proportional to a vacancy concentration. The buffer film 12 according to the present invention may function so as to make the crystal structure variable by utilizing the elastic force.

As shown in FIG. 1, the buffer film 12 has the protruding portion 12b. It is considered that the formation of the protruding portion 12b in this manner is caused by crystal growth while forming a pyramid structure growing with anisotropy along a certain axis or a certain ridge of the crystal when a source material concentration is supersaturated in a film formation process of the buffer film 12.

The buffer film 12 may contain not only ZrO$_2$ but also a rare earth element or an alkaline earth element. In these, ZrO$_2$ may contain oxygen defects. In order to improve the properties, transition metal elements such as Al, Sc, Mn, Fe, Co, and Ni may be contained.

Preferably, the film portion 12a has a thickness of 10 nm or more, and the protruding portion 12b has a thickness of 3 nm to 8 nm.

Figure 2:
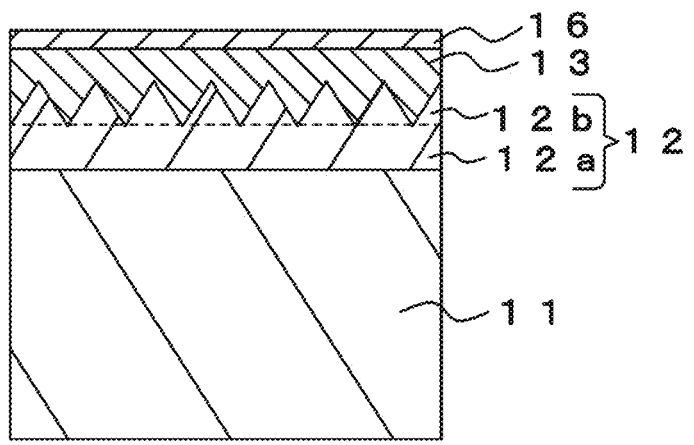
FIG. 2 is a cross-sectional view of the substrate in which a lower electrode is formed on the buffer film according to the present invention.

FIG. 2 is a cross-sectional view of a substrate in which a lower electrode is formed on the buffer film 12 shown in FIG. 1. The lower electrode includes a conductive film 13 and a film 16 which are formed on the buffer film 12 by means of epitaxial growth. The conductive film 13 may be formed using various metals, and for example, Ru, Rh, Pd, Os, Ir, or Pt, which is a platinum group element, may be used. It is known that these materials have physical and chemical properties similar to each other.

The film 16 includes a composite oxide represented by the following general formula (Chem 1), and is, for example, strontium titanate (STO), strontium ruthenate titanate (STRO), or strontium ruthenate (SRO). Note that 0≤x≤1 is satisfied.

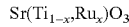

Sr(Ti$_{1-x}$Ru$_x$)O$_3$   (Chem 1)

The lower electrode preferably has a planar surface, the conductive film 13 may have a thickness of at least 20 nm, and the film 16 may have a thickness smaller than that of the conductive film 13.

Figure 3:
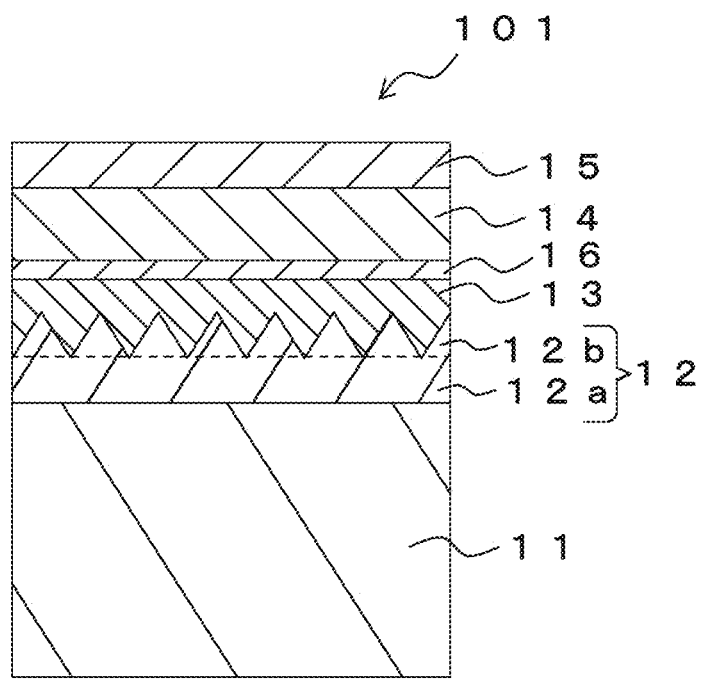
FIG. 3 is a cross-sectional view of a film structure including the buffer film according to the present invention.

FIG. 3 shows a cross-sectional view of a film structure 101 according to the present invention in which a piezoelectric film 14 and a conductive film 15 as an upper electrode are further formed on the substrate shown in FIG. 2.

A material of the piezoelectric film 14 is, for example, a perovskite-type oxide such as lead zirconate titanate (PZT) or barium titanate (BaTiO$_3$). Alternatively, for example, trigonal bismuth ferrite (BiFeO$_3$) may be used. Similarly, trigonal lithium niobate (LiNbO$_3$) or lithium tantalate (LiTaO$_3$) may be used. For example, hexagonal aluminum nitride (AlN) may be used.

For example, a tungsten bronze-type ferroelectric film or a bismuth layered structure ferroelectric film can be used as the piezoelectric film 14. The material having a crystal structure of the tungsten bronze-type ferroelectric film is, for example, Ba$_2$NaNb$_5$O$_{15}$.

A crystal structure of the bismuth layered structure ferroelectric film is represented by the general formula (Bi$_2$O$_2$)$^{2+}$(A$_{m-1}$B$_m$O$_{3m+1}$)$^{2-}$ (m=1 to 5) or Bi$_2$A$_{m-1}$B$_m$O$_{3m+3}$ (m=1 to 5), and has a plurality of pseudo-perovskite structures between (Bi$_2$O$_2$)$^{2+}$ layers. The bismuth layered structure ferroelectric is, for example, bismuth titanate (Bi$_4$Ti$_3$O$_{12}$). Alternatively, for example, bismuth lanthanum titanate (Bi$_{4-x}$La$_x$)Ti$_3$O$_{12}$(0<x<1) may be used.

Not only the piezoelectric film 14 described above, but also a superconductor film 14 may be formed using, as a material, an yttrium-based superconductor such as YBa$_2$Cu$_3$O$_7$ (YBCO) or a bismuth-based superconductor such as Bi$_2$SrCa$_2$Cu$_3$O$_{10}$ (BSCCO) which has a perovskite structure.

When the material for forming the piezoelectric film or the superconductor film as described above is used, the single crystal piezoelectric film 14 or the single crystal superconductor film 14 may be formed on the buffer film 12.

The conductive film 15 is formed on the piezoelectric film 14. The conductive film may be formed of the same material as that of the conductive film 13. The film 16 may be expected to have an effect of enhancing the adhesion between the conductive film 13 and the piezoelectric film 14.

EXAMPLE

Hereinafter, the present embodiment will be described in more detail based on examples. The present invention is not limited to the following examples.

In Examples 1 to 4, a (100)-oriented Si substrate was used as the substrate 11 to prepare the film structure 101 shown in FIG. 3. The piezoelectric film 14 was formed using, as a sputtering target. PZT (30/70) (Pb(Zr$_{0.3}$,Ti$_{0.7}$)O$_3$) in Example 1, BTO(BaTiO$_3$) in Example 2, BFO(BiFeO$_3$) in Example 3, and BLT ((Bi$_{3.25}$, La$_{0.75}$)Ti$_3$O$_{12}$) in Example 4.

First, a ZrO$_2$ film was formed as the buffer film 12 on the substrate 11 by an electron beam evaporation method. The conditions at this time are shown below.

Apparatus: Electron beam evaporation apparatus
Pressure: 7.0×10$^{-3}$ Pa
Vapor deposition source: Zr+O$_2$
Flow rate of O$_2$: 10 sccm
Acceleration voltage/emission current: 7.5 kV/1.8 mA
Thickness: 25 nm
Substrate temperature: 600° C.

Figure 4A:
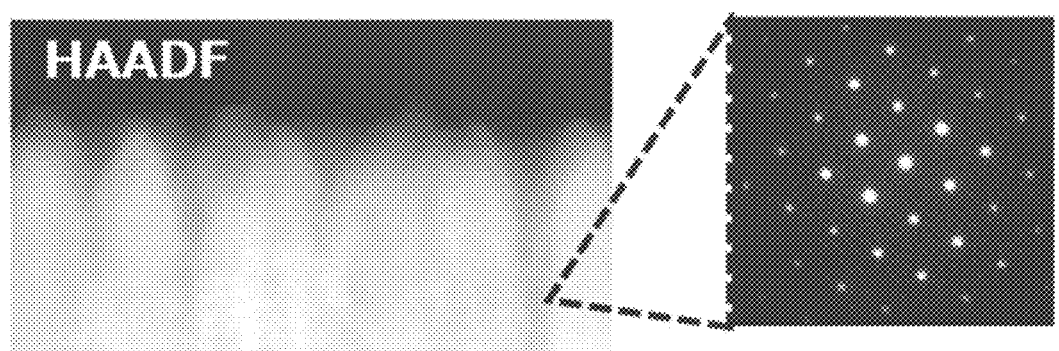
FIG. 4A is an STEM image obtained by forming $ZrO_2$ as a buffer film 12 on a substrate 11 and then observing a cross section thereof.
Figure 4B:
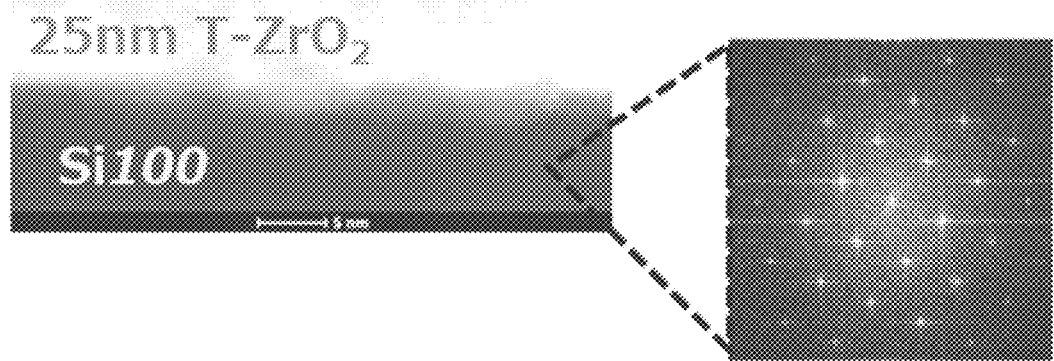
FIG. 4B shows an electron diffraction image of the substrate 11 in a lower diagram and shows an electron diffraction image of the buffer film 12 in an upper diagram.

FIG. 4A is an STEM image obtained by forming ZrO$_2$ as the buffer film 12 on the substrate 11 and then observing a cross section thereof. FIG. 4B shows an electron diffraction image of the substrate 11 in a lower diagram and shows an electron diffraction image of the buffer film 12 in an upper diagram.

As shown in FIG. 4A, the buffer film 12 includes the protruding portion 12b whose surface has a pyramid shape, and it may be seen that the buffer film 12 includes the film portion 12a and the protruding portion 12b. As may be seen from the upper diagram in FIG. 4B, the buffer film 12 is an aggregate of fine ZrO$_2$ single crystals, and is formed on an upper surface of the substrate 11 by means of epitaxial growth.

Figure 5A:
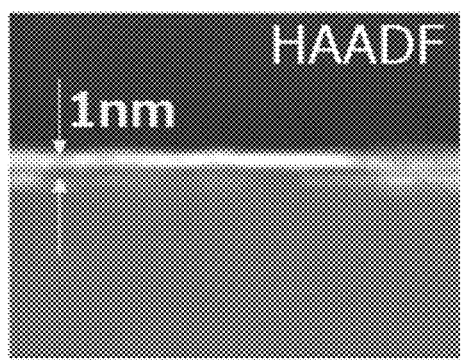
FIG. 5A is an STEM image observing cross sections when the buffer film 12 is formed to have a thickness of 1 nm.
Figure 5B:
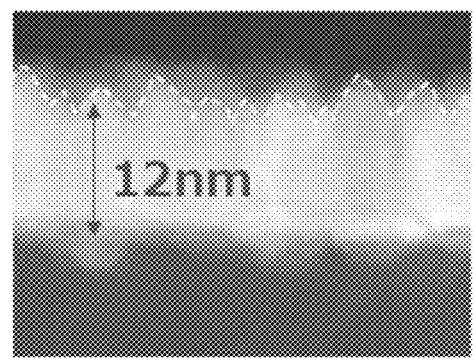
FIG. 5B is an STEM image observing cross sections when the buffer film 12 is formed to have a thickness of 12 nm.
Figure 5C:
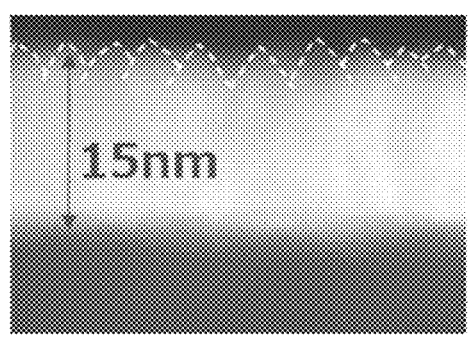
FIG. 5C is an STEM image observing cross sections when the buffer film 12 is formed to have a thickness of 15 nm.
Figure 5D:
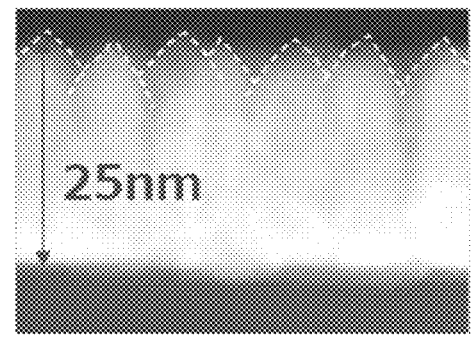
FIG. 5D is an STEM image observing cross sections when the buffer film 12 is formed to have a thickness of 25 nm.

FIGS. 5A to 5D shows a cross-sectional view by STEM for each film formation time of the buffer film 12. FIG. 5A shows a state when the buffer film 12 is formed to have a thickness of 1 nm, FIG. 5B shows a state when the buffer film 12 is formed to have a thickness of 12 nm, FIG. 5C shows a state when the buffer film 12 is formed to have a thickness of 15 nm, and FIG. 5D shows a state when the buffer film 12 is formed to have a thickness of 25 nm. In FIGS. 5B to 5D, a shape of the protruding portion 12b was emphasized by a white dotted line so that the shape of the protrusion 12b can be seen.

As shown in FIG. 5A, it was found that the protruding portion 12b was not formed immediately after the buffer film 12 was formed. A film formation time at this time was 3 seconds. Next, a sample in which the buffer film 12 was formed for 1 minute was prepared, and the cross section thereof was observed (FIG. 5B). It was found that a height of the protruding portion 12b shown in FIG. 5B was non-uniform. Next, a sample in which the buffer film 12 was formed for 5 minutes was prepared, and the cross section thereof was observed (FIG. 5C). A height of the protruding portion 12b shown in FIG. 5C was more uniform than that of the protruding portion 12b shown in FIG. 5B. Next, a sample in which the buffer film 12 was formed for 8 minutes was prepared, and the cross section thereof was observed (FIG. 5D). A height of the protruding portion 12b shown in FIG. 5D was more uniform than that of the protruding portion 12b shown in FIG. 5B or FIG. 5C.

The average heights of the protruding portions 12b shown in FIGS. 5B to 5D were 2.2 nm in FIG. 5B, 3.33 nm in FIG. 5C, and 4.67 nm in FIG. 5D, respectively, when the average height was calculated based on the images. The protruding portion 12b is a quadrangular pyramid in shape, and a length of a diagonal line of a bottom surface was 3.3 nm in FIG. 5B, 5.0 nm in FIG. 5C, and 7.0 nm in FIG. 5D.

From the above results, as the buffer film 12 was formed, a size of the quadrangular pyramid was increased, and the height of the protruding portion 12b was increased in accordance with the film formation time. In a case where the buffer film 12 when the buffer film 12 was formed for 0.05 minutes (3 seconds) (FIG. 5A) is regarded as a planar surface having a surface area of 1.0, the surface area of the buffer film 12 in FIGS. 5B to 5D was 1.30 to 1.60 times as large as that of the buffer film 12 in FIG. 5A.

A film formation rate was calculated to be 3.33 [nm/sec] in FIG. 5A. 2.0 [nm/sec] in FIG. 5B, 0.50 [nm/sec] in FIG. 5C, and 0.52 [nm/sec] in FIG. 5D. As described above, according to the film formation rate for each film thickness of the buffer film 12, it was found that the film formation rate becomes constant when the film thickness is larger than 15 nm.

Figure 6:
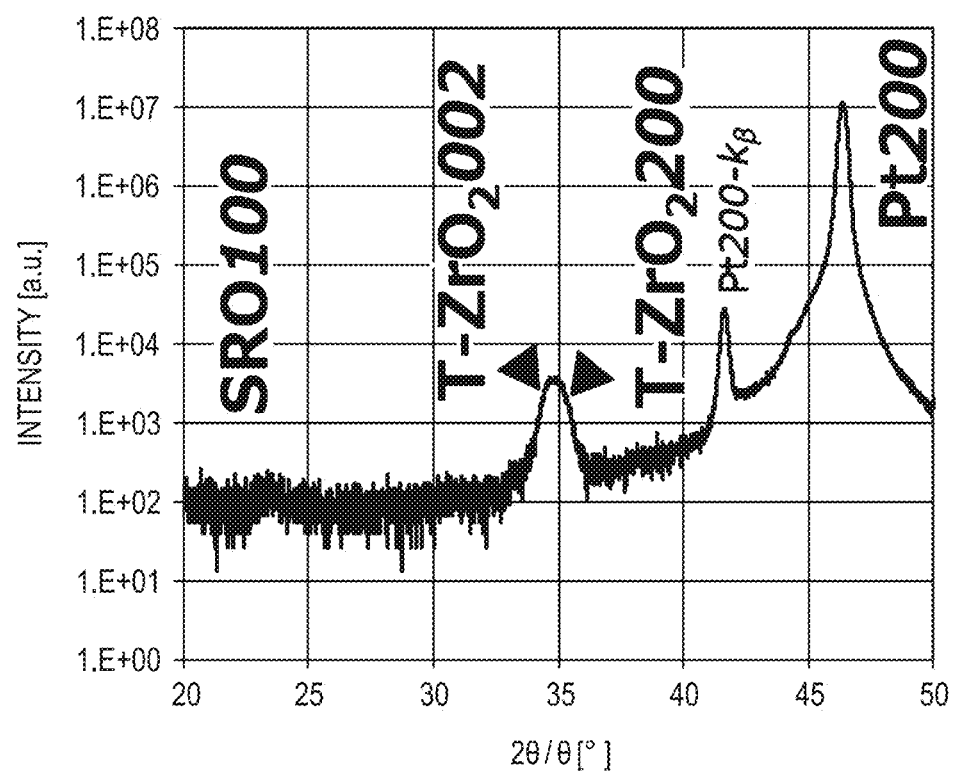
FIG. 6 shows a result of measuring a θ-2θ spectrum for a film structure 101 by XRD.

FIG. 6 shows a result of measuring a θ-2θ spectrum by XRD after the conductive film 13 and the film 16 are formed by a method described later. As shown in FIG. 6, according to a position of a peak, it was found that $ZrO_2$ as the buffer film 12 had a tetragonal crystal structure oriented in a (200) plane.

Next, a platinum (Pt) film was formed as the conductive film 13 on the buffer film 12 by a sputtering method. The conditions at this time are shown below.
Apparatus: DC sputtering apparatus
Pressure: $1.2 \times 10^{-1}$ Pa
Vapor deposition source: Pt
Electric power: 100 W
Thickness: 150 nm
Substrate temperature: 450° C. to 600° C.

Figure 7A:
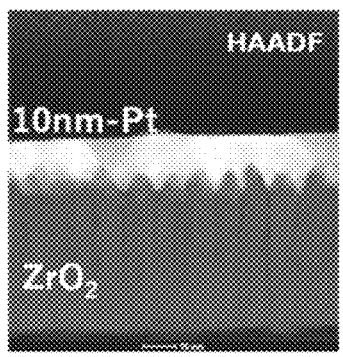
FIG. 7A is an STEM image observing a cross section when a conductive film 13 is formed to have a thickness of 10 nm.
Figure 7B:
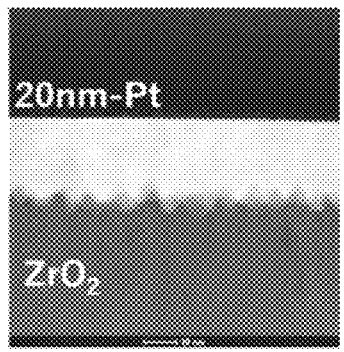
FIG. 7B is an STEM image observing a cross section when the conductive film 13 is formed to have a thickness of 20 nm.
Figure 7C:
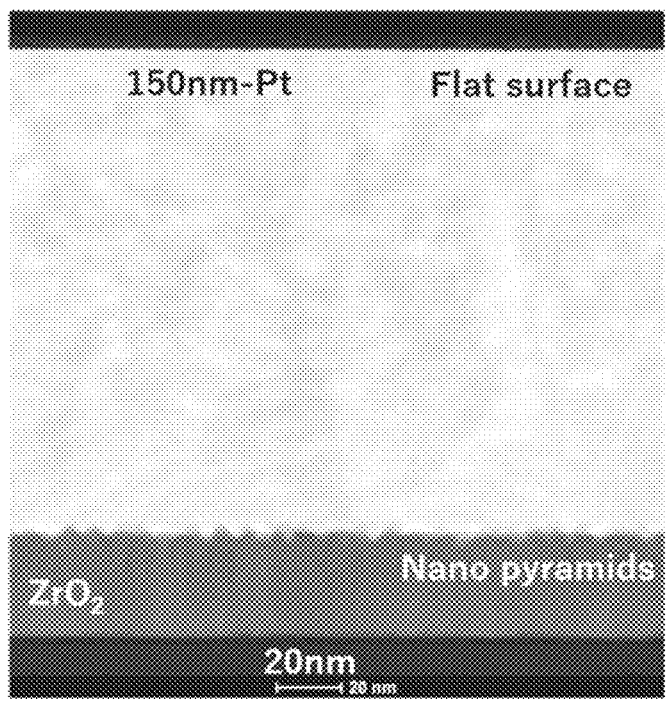
FIG. 7C is an STEM image observing a cross section when the conductive film 13 is formed to have a thickness of 150 nm.

FIGS. 7A to 7C are STEM images obtained by forming a Pt film as the conductive film 13 on the buffer film 12 and then observing a cross section thereof. FIG. 7A shows a state in which the conductive film 13 is formed to have a thickness of 10 nm, FIG. 7B shows a state in which the conductive film 13 is formed to have a thickness of 20 nm, and FIG. 7C shows a state in which the conductive film 13 is formed to have a thickness of 150 nm.

As shown in FIG. 7A, it was found that a surface of the conductive film 13 was substantially planarized even with a film thickness of 10 nm. Then, as shown in FIG. 7B, by setting the film thickness to 20 nm, the surface of the conductive film 13 was further flattened, and even when the conductive film 13 was further formed to 150 nm, the flatness was maintained as shown in FIG. 7C.

Next, a $SrRuO_3$ (SRO) film was formed as the film 16 on the conductive film 13 by a sputtering method. The conditions at this time are shown below.
Apparatus: RF magnetron sputtering apparatus
Power: 300 W
Gas: Ar
Pressure: 1.8 Pa
Thickness: 20 nm
Substrate temperature: 600° C.

Next, the piezoelectric film 14 was formed on the film 16. In Examples 1 to 4, the formation conditions were the same, and only the sputtering target was different.
Apparatus: RF magnetron sputtering apparatus
Material: [Example 1: PZT (30/70)] $Pb(Zr_{0.3},Ti_{0.7})O_3$,
　　[Example 2: BTO] $BaTiO_3$,
　　[Example 3: BFO] $BiFeO_3$,
　　[Example 4: BLT] $(Bi_{3.25}, La_{0.75})Ti_3O_{12}$
Power: 1500 W
Gas: $Ar/O_2$
Pressure: 1.0 Pa
Substrate temperature: 450° C.

Example 1

In Example 1, as the film structure 101, a film was formed as Si/$ZrO_2$/Pt/SRO/PZ/Pt. Si(100) was used for the substrate 11. After PZT (30/70) was formed as the piezoelectric film 14, a film thickness thereof was measured by XRF using a fluorescent X-ray analyzer (AZX400, manufactured by Rigaku Corporation) and found to be 1.0 μm.

Figure 8:
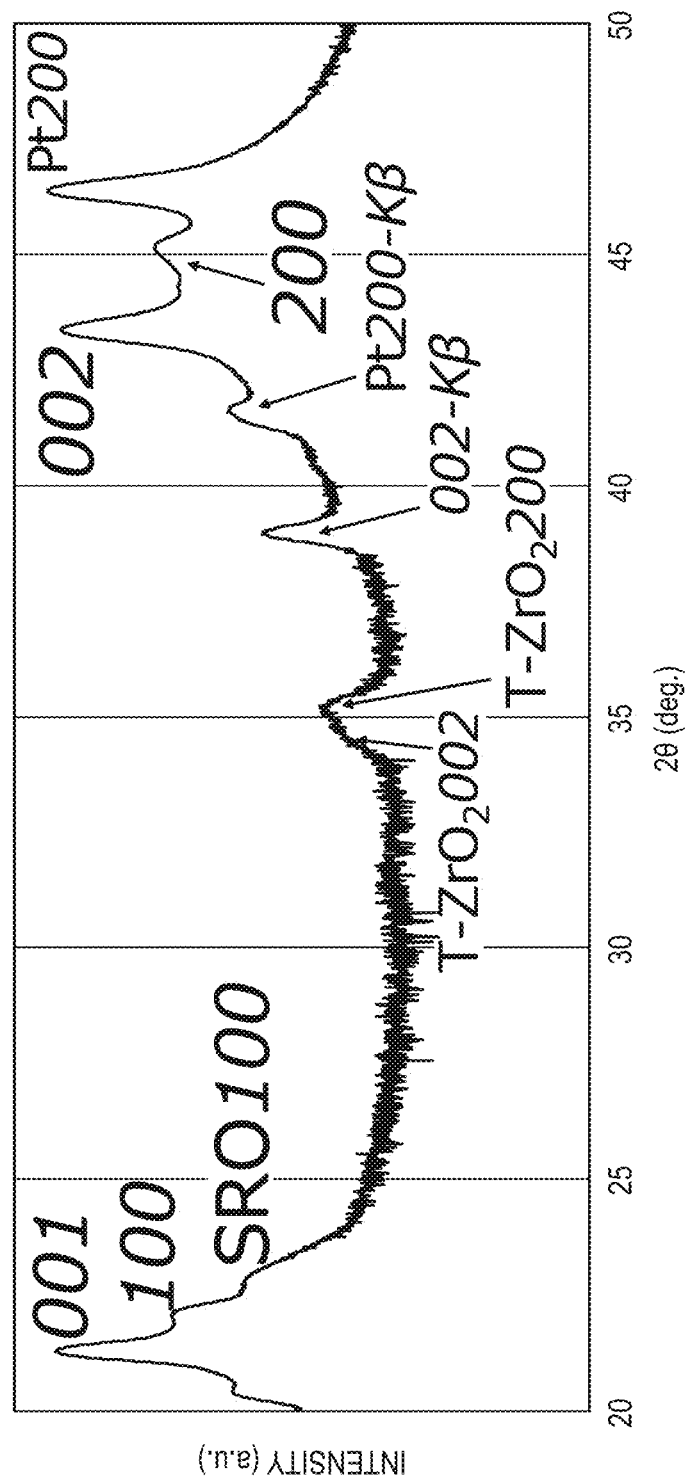
FIG. 8 shows a result of measuring a θ-2θ spectrum for the film structure 101 according to Example 1 by an XRD method.

FIG. 8 shows a result of measuring a θ-2θ spectrum for the film structure 101 according to Example 1 by an XRD method. As shown in FIG. 8, it was found that PZT (30/70) is preferentially oriented to a c-axis. A lattice constant a and a lattice constant c were determined based on the X-ray diffraction pattern, and a c/a axial ratio was calculated to be 1.046.

Figure 9:
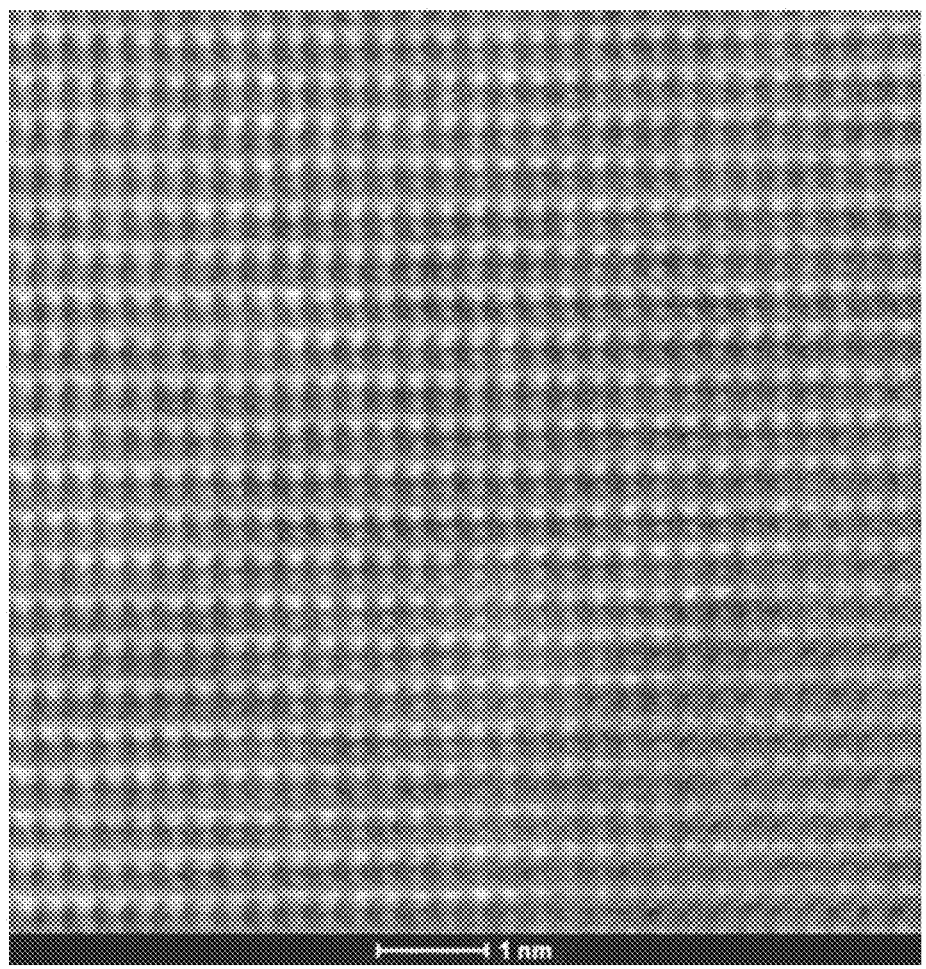
FIG. 9 shows a lattice image by STEM observing a cross section of PZT (30/70) as a piezoelectric film 14 according to Example 1.

FIG. 9 shows a lattice image obtained by STEM observing PZT (30/70) as the piezoelectric film 14 in across-section of the film structure 101. As shown in FIG. 9, it was confirmed that the piezoelectric film 14 was a single crystal without disturbance of crystal lattice such as transition.

Figure 10A:
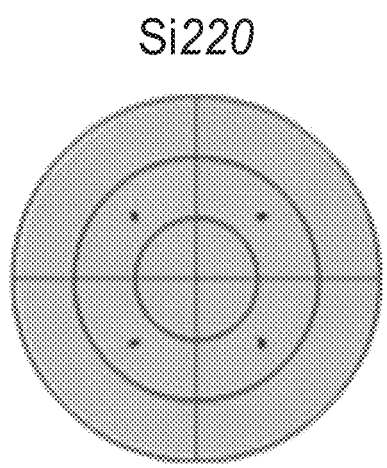
FIG. 10A is a pole figure of a Si(220) plane of the film structure 101 according to Example 1.
Figure 10B:
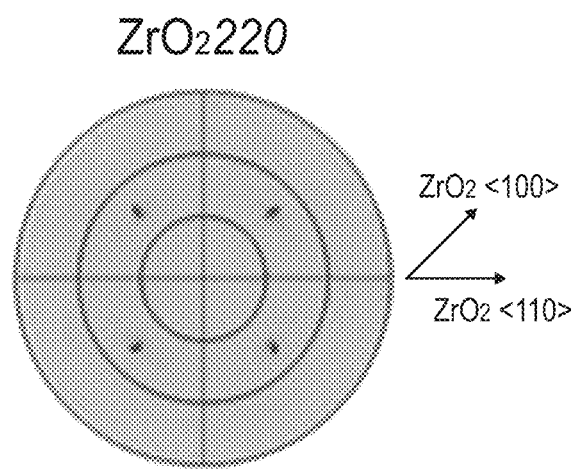
FIG. 10B is a pole figure of a $ZrO_2$(220) plane of the film structure 101 according to Example 1.
Figure 10C:
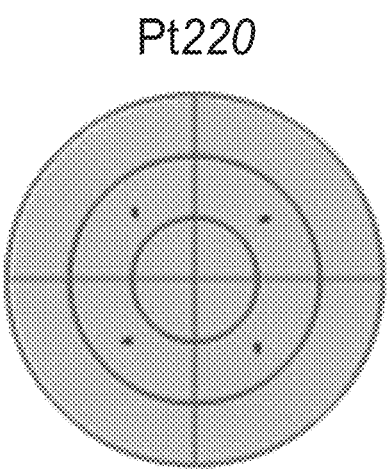
FIG. 10C is a pole figure of Pt(220) of the film structure 101 according to Example 1.
Figure 10D:
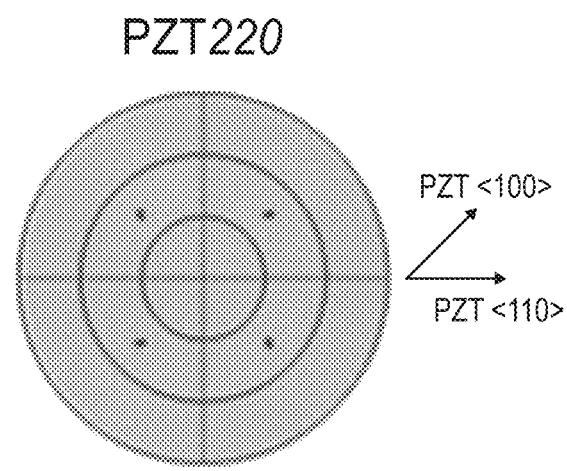
FIG. 10D is a pole figure of PZT(202) of the film structure 101 according to Example 1.

FIGS. 10A to 10D show results of in-plane orientation relationships of the films of the respective layers of the film structure 101 according to Example 1 obtained by measuring pole figures of the respective layers by the XRD method. FIG. 10A is a pole figure of a Si(220) plane, FIG. 10B is a pole figure of a $ZrO_2$(220) plane, FIG. 10C is a pole figure of Pt(220), and FIG. 10D is a pole figure of PZT(202).

As shown in FIGS. 10A to 10D, peaks of four-fold symmetry were observed, and it was found that epitaxial growth was performed so that the in-plane orientation was aligned with the substrate.

Figure 11:
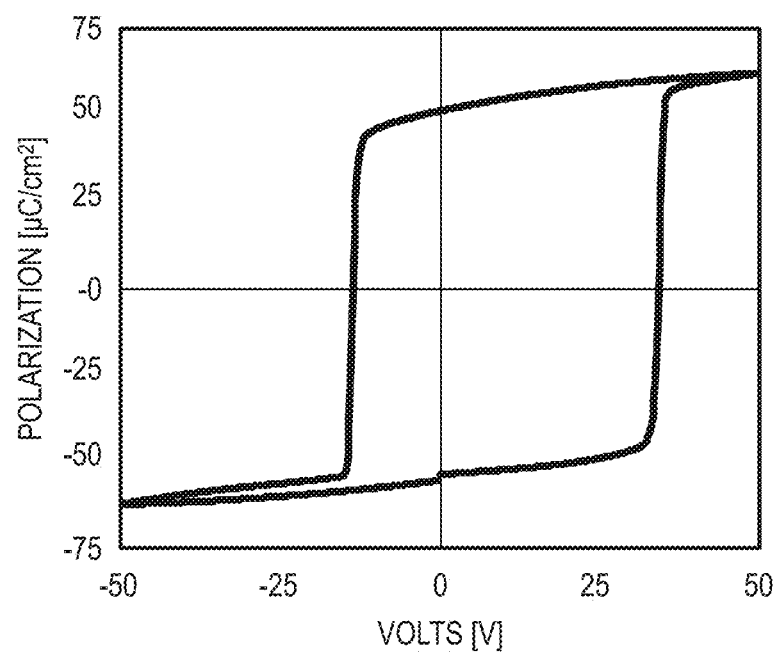
FIG. 11 is a diagram showing a voltage dependence of polarization of the piezoelectric film 14 according to Example 1.

FIG. 11 is a graph showing a voltage dependence of polarization of the piezoelectric film 14 according to Example 1. As shown in FIG. 11, the piezoelectric film 14 according to Example 1 exhibited good properties, the residual polarization Pr was 50 $\mu C/cm^2$, and the coercive electric field Ec was 180 kV/cm.

Example 2

In Example 2, a film was formed as Si/ZrO$_2$/Pt/SRO/BTO. Si(100) was used for the substrate 11. After BTO was formed as the piezoelectric film 14, a film thickness thereof was measured by XRF and found to be 1.0 µm.

Figure 12:
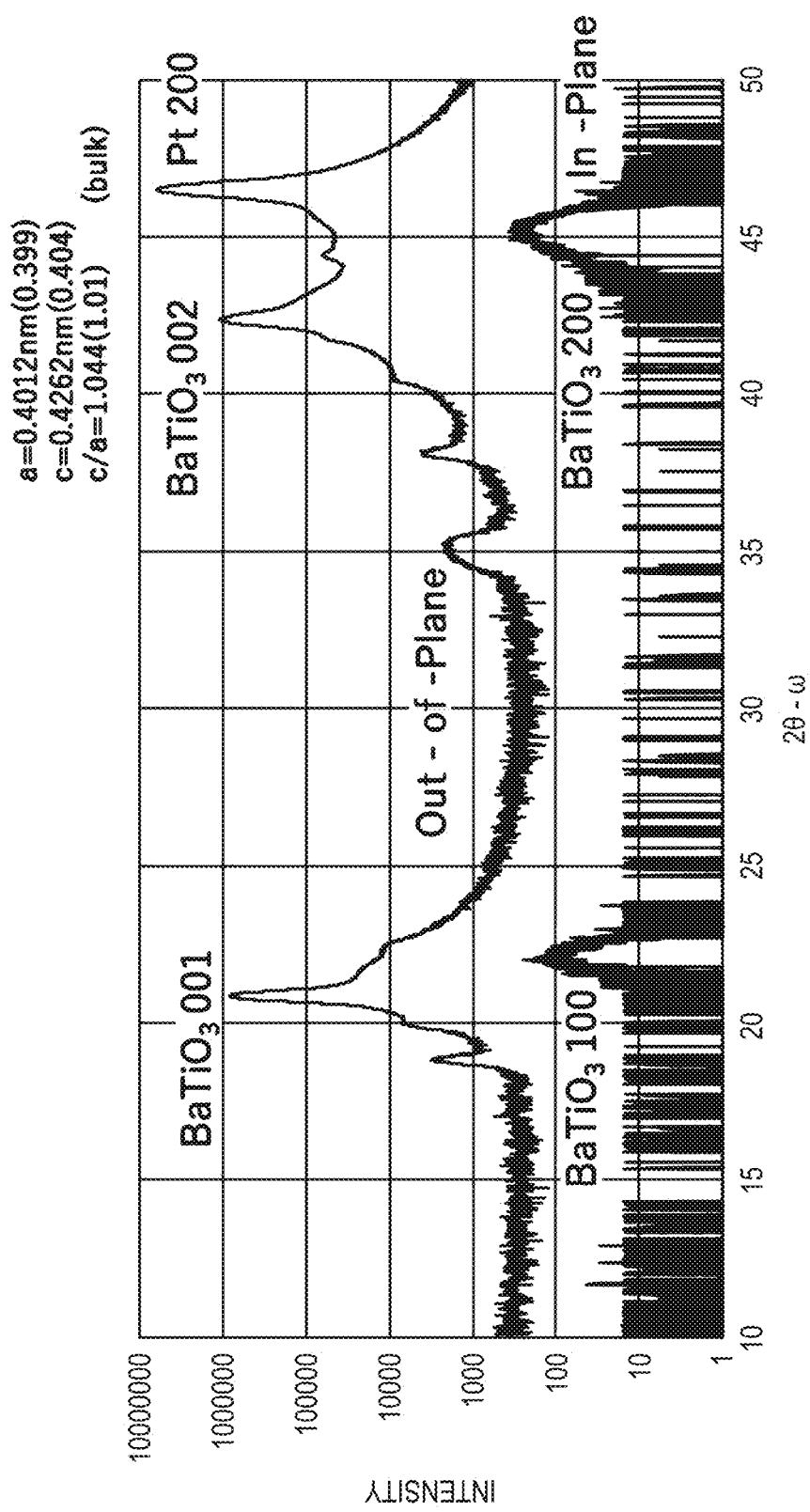
FIG. 12 shows a result of measuring a θ-2θ spectrum for the film structure 101 according to Example 2 by an XRD method.

FIG. 12 shows a result of measuring a θ-2θ spectrum for the film structure 101 according to Example 2 by an XRD method. In FIG. 12, a curve on an upper side indicates a result of the Out-of-Plane measurement, and a curve on a lower side indicates the result of the In-Plane measurement.

As shown in FIG. 12, the piezoelectric film 14 was preferentially oriented in a (001) plane. When an a-axis length and a c-axis length of the piezoelectric film 14 were calculated from the measurement results, the a-axis length was 0.4012 nm and the c-axis length was 0.4262 nm. Therefore, a c/a ratio was 1.044, and it was found that the c-axis length was longer than 1.01, which is the numerical value of a bulk.

FIGS. 13A and 13B show X-ray diffraction patterns obtained by φ scanning of the film structure 101 according to Example 2. FIG. 13A shows the pattern of the substrate 11, and FIG. 13B shows the pattern of the piezoelectric film 14. As can be seen from FIGS. 13A and 13B, it was found that the piezoelectric film 14 has a four-fold symmetry axis at the same angle as that of the substrate 11, and that even the piezoelectric film 14 was formed by Cube-On-Cube.

Figure 14:
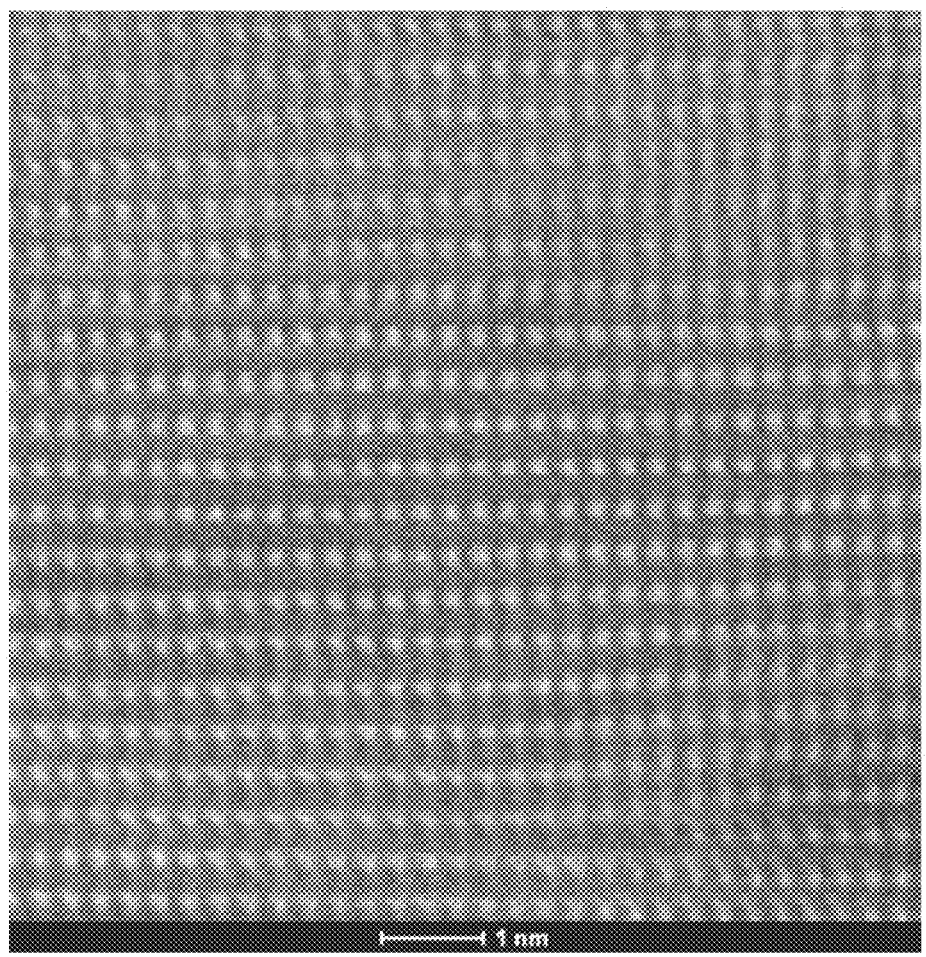
FIG. 14 shows a lattice image by STEM observing a cross section of BTO as the piezoelectric film 14 according to Example 2.

FIG. 14 shows a lattice image obtained by STEM observing BTO as the piezoelectric film 14 in a cross-section of the film structure 101 according to Example 2, and. As shown in FIG. 14, it was confirmed that the piezoelectric film 14 was a single crystal without disturbance of crystal lattice such as transition.

Figure 15:
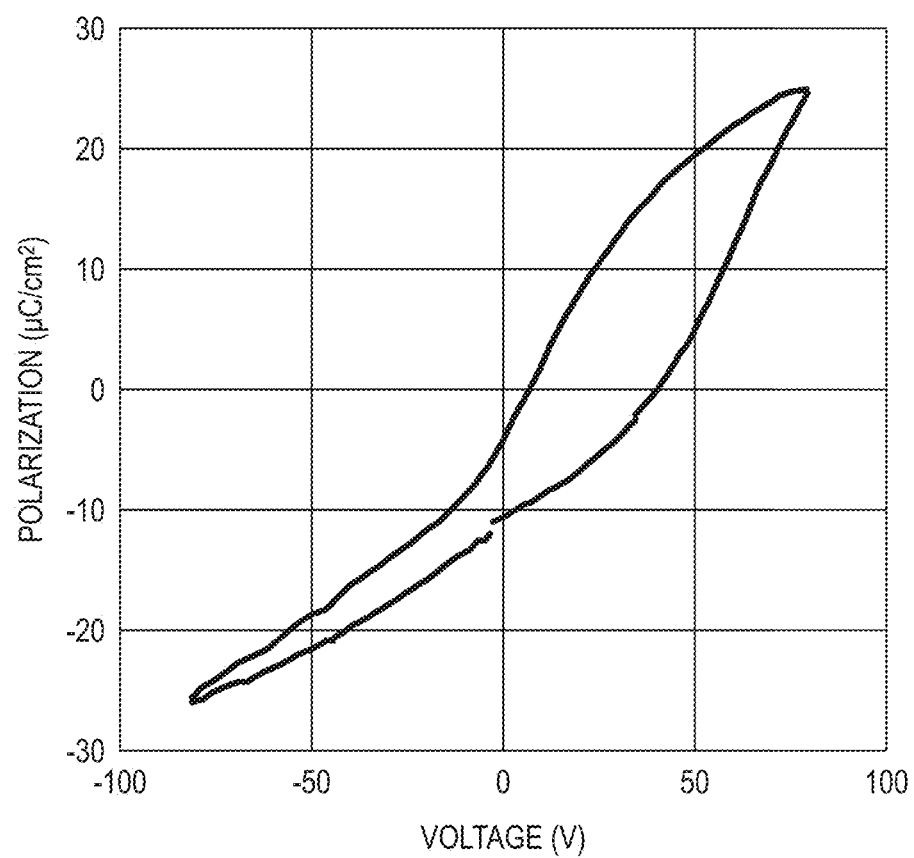
FIG. 15 is a diagram showing a voltage dependence of polarization of the piezoelectric film 14 according to Example 2.

FIG. 15 is a graph showing a voltage dependence of polarization of the piezoelectric film 14. As shown in FIG. 15, the piezoelectric film 14 according to Example 2 exhibited ferroelectricity.

Figure 16:
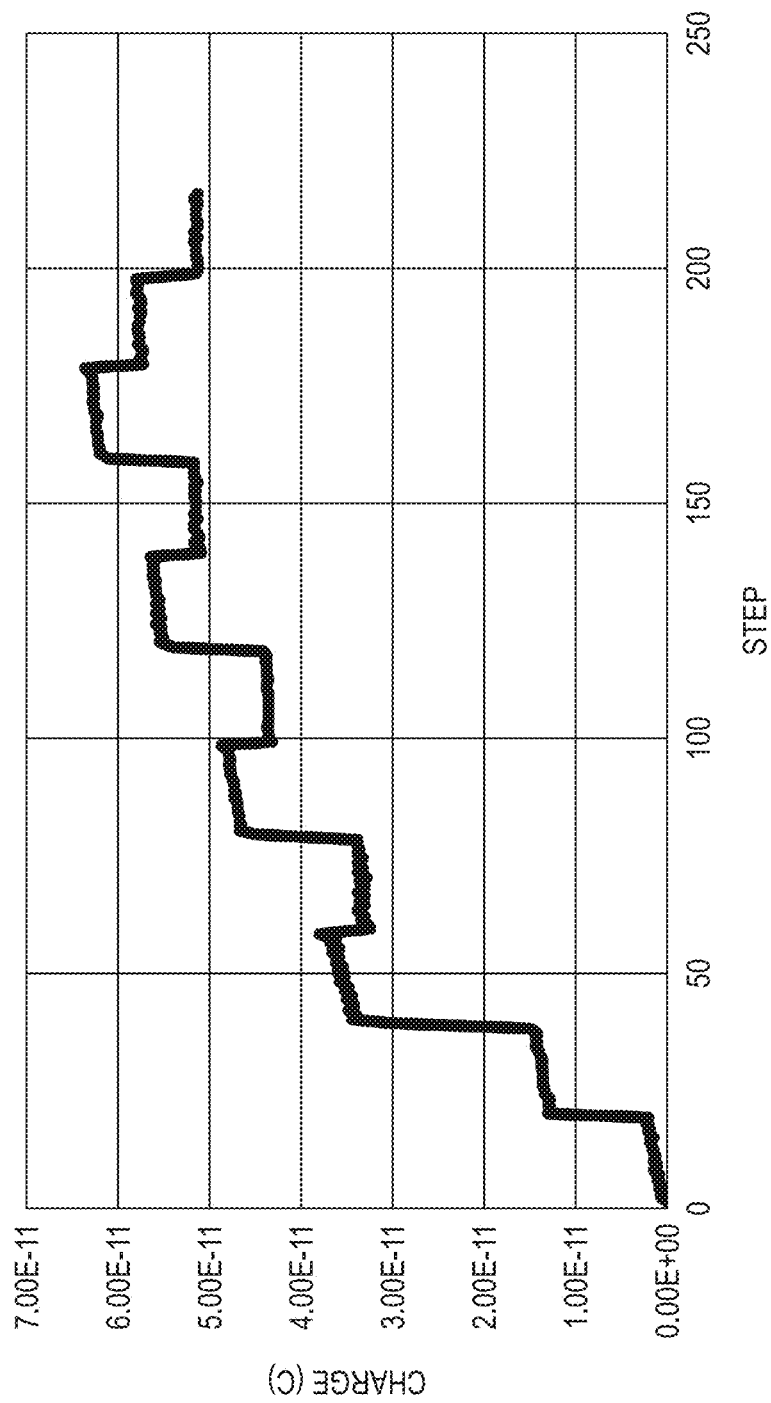
FIG. 16 is a diagram showing piezoelectricity of BTO as the piezoelectric film 14 according to Example 2.

FIG. 16 shows piezoelectricity of the piezoelectric film 14 confirmed by a d33 meter. The d33 meter is a d33 constant measuring apparatus (model: LTFA-01) manufactured by LeadTechno Co., Ltd., and can measure d33 without the conductive film 15 as an upper electrode. Specifically, a force is applied to the film structure 101 and a change in the amount of charge is detected by an integration circuit. When the film structure 101 has piezoelectricity, a pulse waveform can be observed by applying or not applying a force at regular time intervals as shown in FIG. 16. A d33 value at this time was 24.88 (pC/N).

Example 3

In Example 3, a film was formed as Si/ZrO$_2$/Pt/SRO/BFO. Si(100) was used for the substrate 11. After formation of BFO as the piezoelectric film 14, a film thickness was measured by XRF and found to be 2.1 µm.

Figure 17:
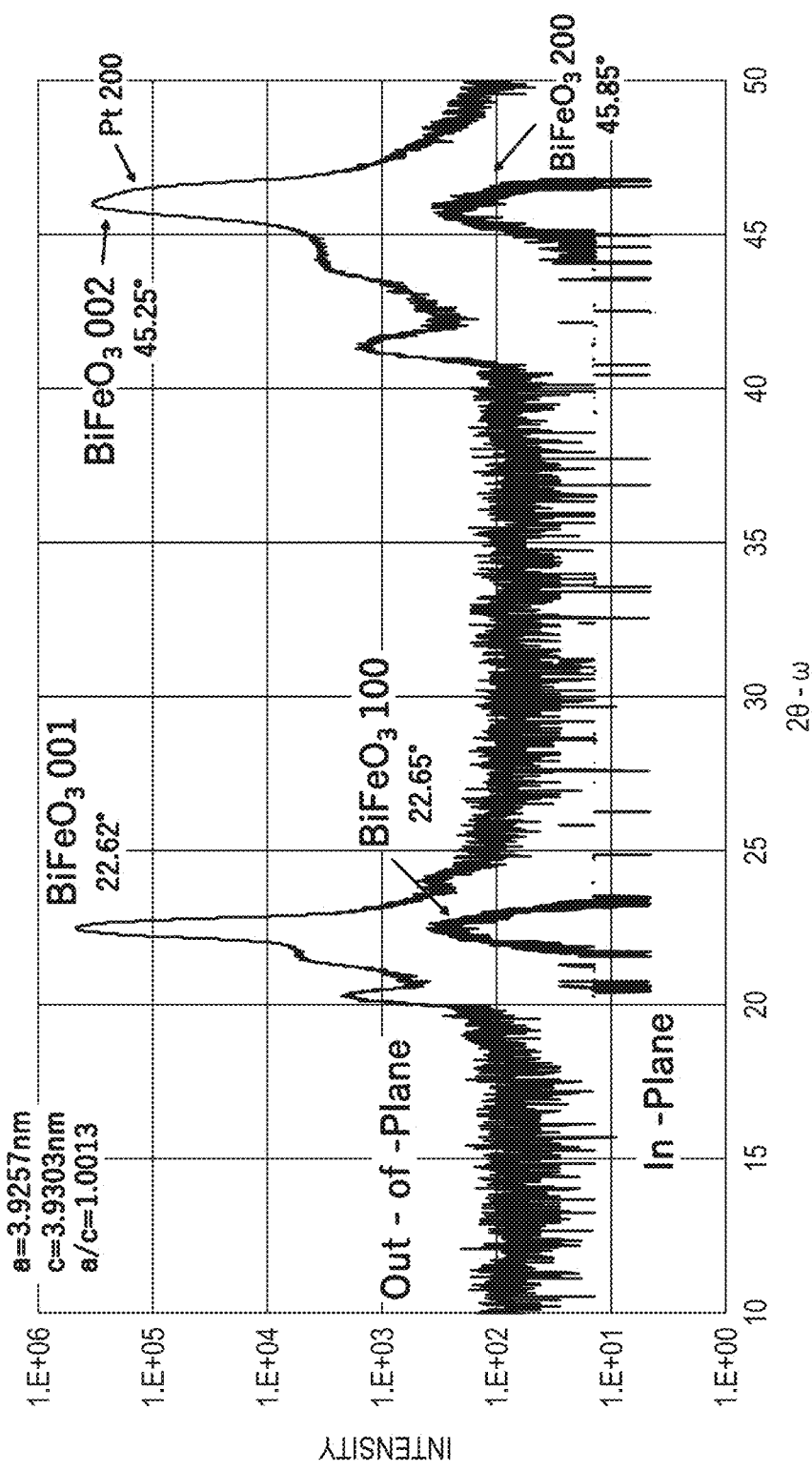
FIG. 17 shows a result of measuring a θ-2θ spectrum for the film structure 101 according to Example 3 by an XRD method.

FIG. 17 shows a result of measuring a θ-2θ spectrum for the film structure 101 according to Example 3 by an XRD method. In FIG. 17, a curve on an upper side indicates a result of the Out-of-Plane measurement, and a curve on a lower side indicates the result of the In-Plane measurement. As shown in FIG. 17, the piezoelectric film 14 was preferentially oriented in a (001) plane.

Figure 18A:
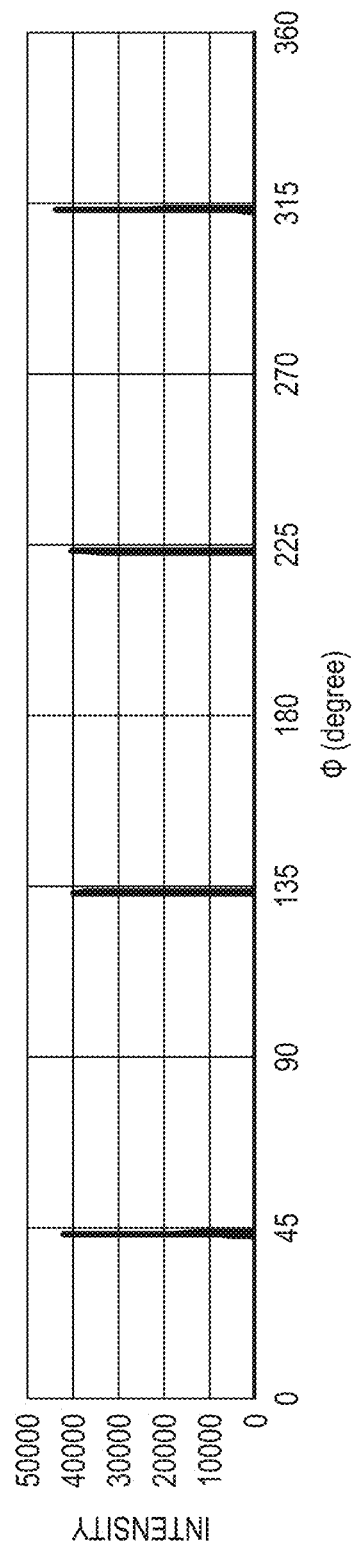
FIG. 18A shows the substrate 11 of the film structure 101 according to Example 3.
Figure 18B:
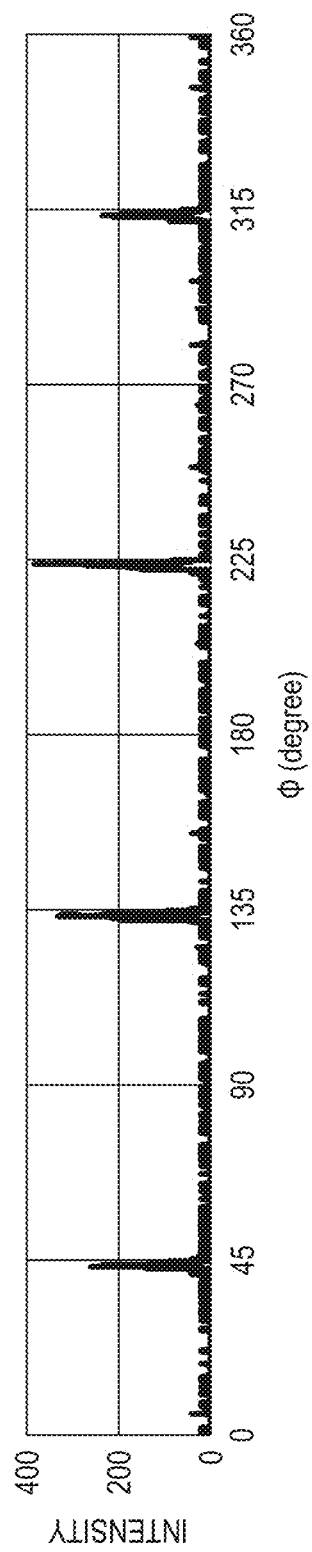
FIG. 18B shows an X-ray diffraction pattern obtained by φ scanning of the piezoelectric film 14 of the film structure 101 according to Example 3.

FIGS. 18A and 18B show X-ray diffraction patterns by φ scanning. FIG. 18A shows a pattern of the substrate 11, and FIG. 18B shows a pattern of the piezoelectric film 14. As can be seen from FIGS. 18A and 18B, it was found that after the piezoelectric film 14 was formed, the piezoelectric film 14 had a four-fold symmetry axis at the same angle as that of the substrate 11, and that even the piezoelectric film 14 was formed by Cube-On-Cube.

Figure 19:
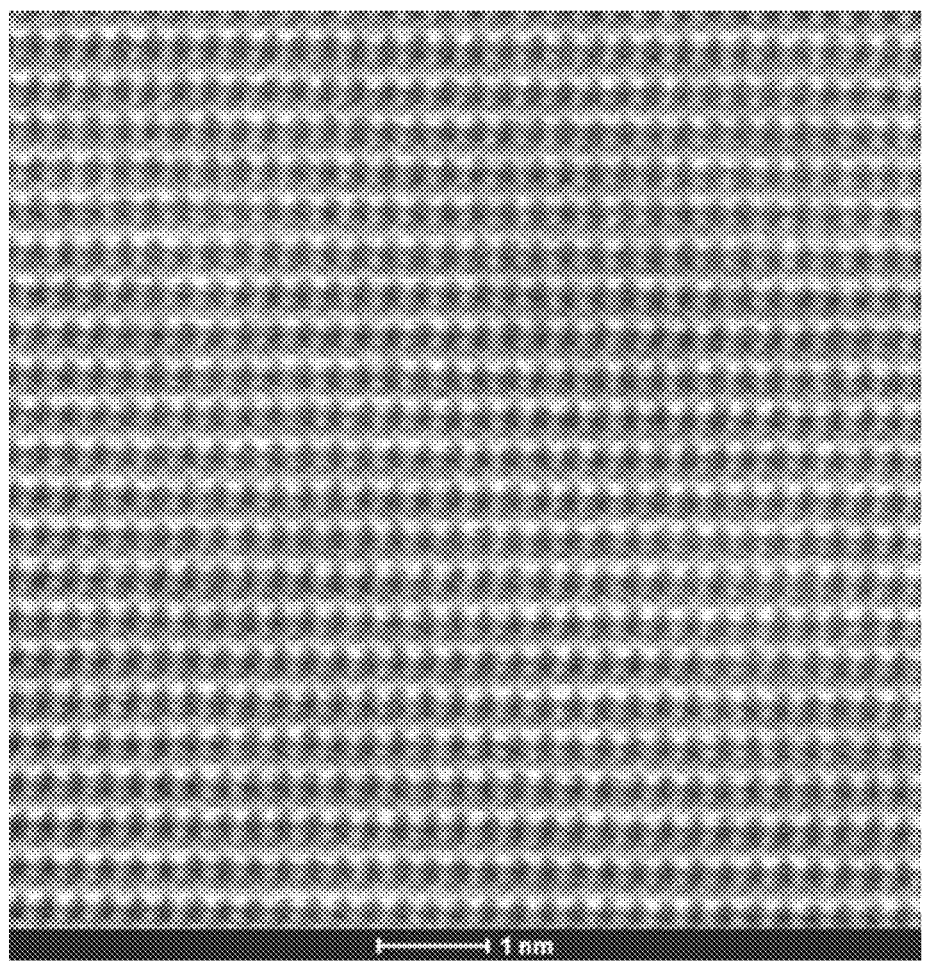
FIG. 19 shows a lattice image by STEM observing a cross section of BFO as the piezoelectric film 14 according to Example 3.

FIG. 19 shows a lattice image by STEM observing BFO as the piezoelectric film 14 in a cross-section of the film structure 101. As shown in FIG. 19, it was confirmed that the piezoelectric film 14 was a single crystal without disturbance of crystal lattice such as transition.

Figure 20:
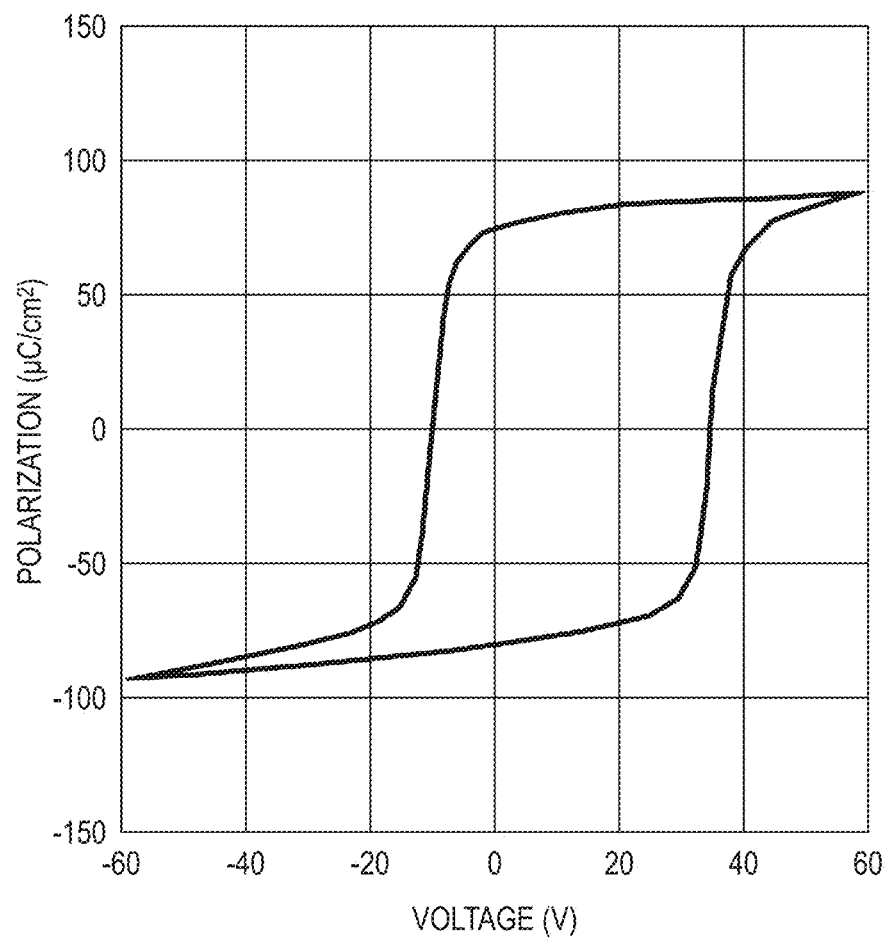
FIG. 20 is a diagram showing a voltage dependence of polarization of the piezoelectric film 14 according to Example 3.

FIG. 20 is a graph showing a voltage dependence of polarization of the piezoelectric film 14. As shown in FIG. 20, the piezoelectric film 14 according to Example 3 exhibited good properties, the residual polarization Pr was 60 $\mu C/cm^2$, and the coercive electric field Ec was 100 kV/cm.

Figure 21:
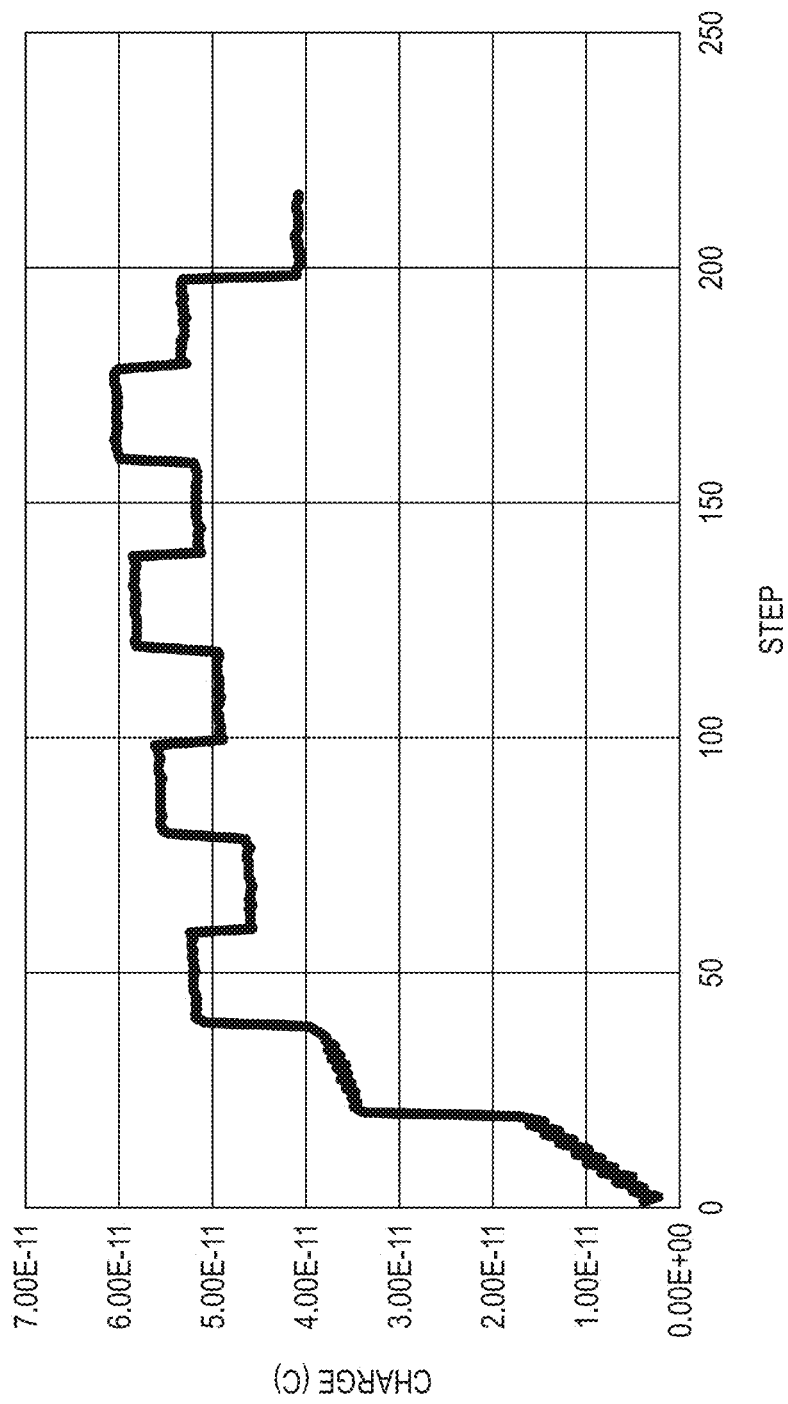
FIG. 21 is a diagram showing piezoelectricity of BFO as the piezoelectric film 14 according to Example 3.

FIG. 21 is a diagram showing a measurement result of the piezoelectric film 14 by a d33 meter. As shown in FIG. 21, it was found that the piezoelectric film 14 had piezoelectricity. A d33 value at this time was 16.69 (pC/N).

Example 4

In Example 4, a film was formed as Si/ZrO$_2$/Pt/SRO/BLT. Si(100) was used for the substrate 11. After the formation of BLT as the piezoelectric film 14, a film thickness thereof was measured by XRF and found to be 1.0 µm.

Figure 22:
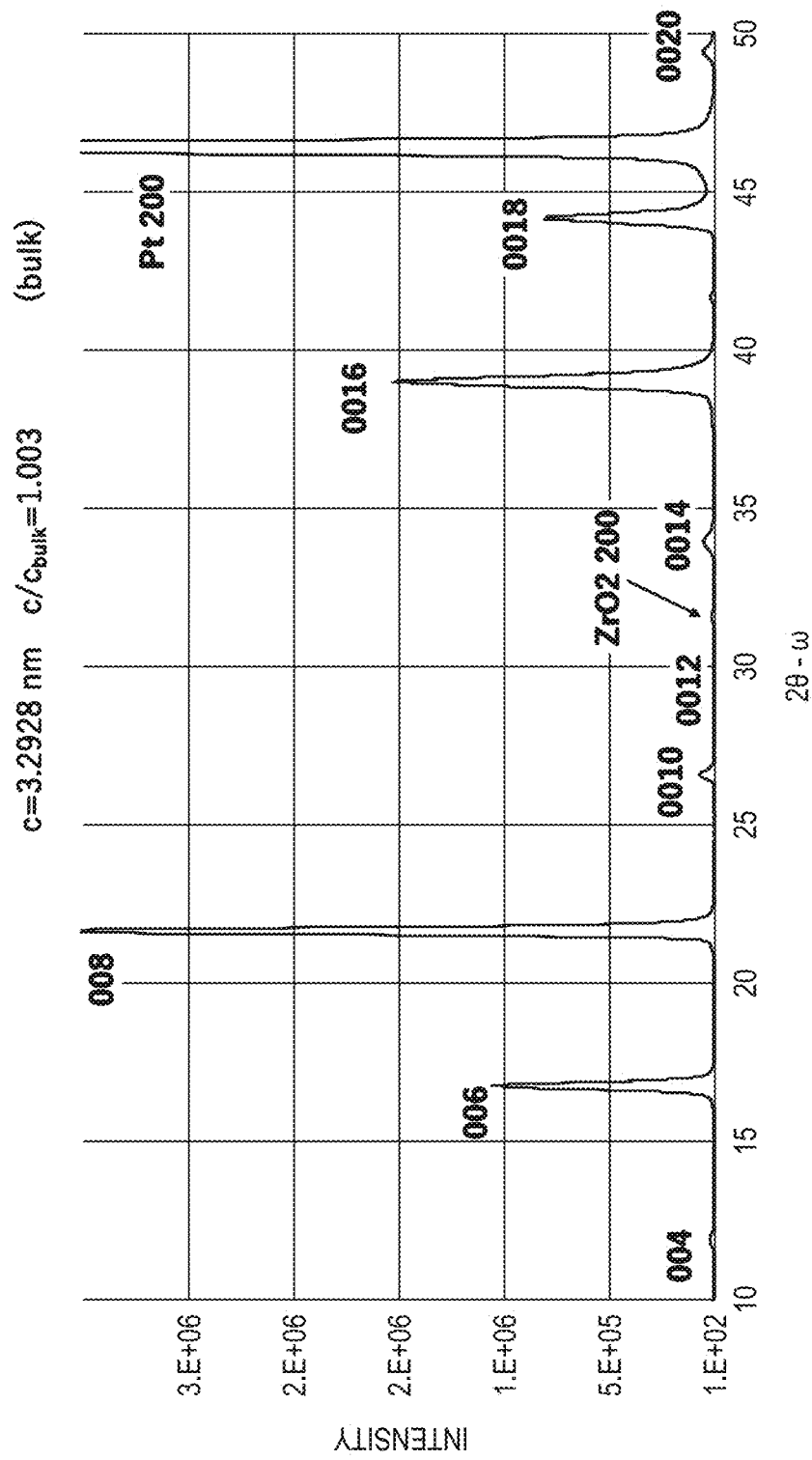
FIG. 22 shows a result of measuring a θ-2θ spectrum for Out-of-Plane of the film structure 101 according to Example 4 by an XRD method.

FIG. 22 shows a result of measuring a θ-2θ spectrum for the film structure 101 according to Example 4 by an XRD method. FIG. 22 shows the results of Out-of-Plane measurement. As shown in FIG. 22, the piezoelectric film 14 was preferentially oriented in a (001) plane.

Figure 23A:
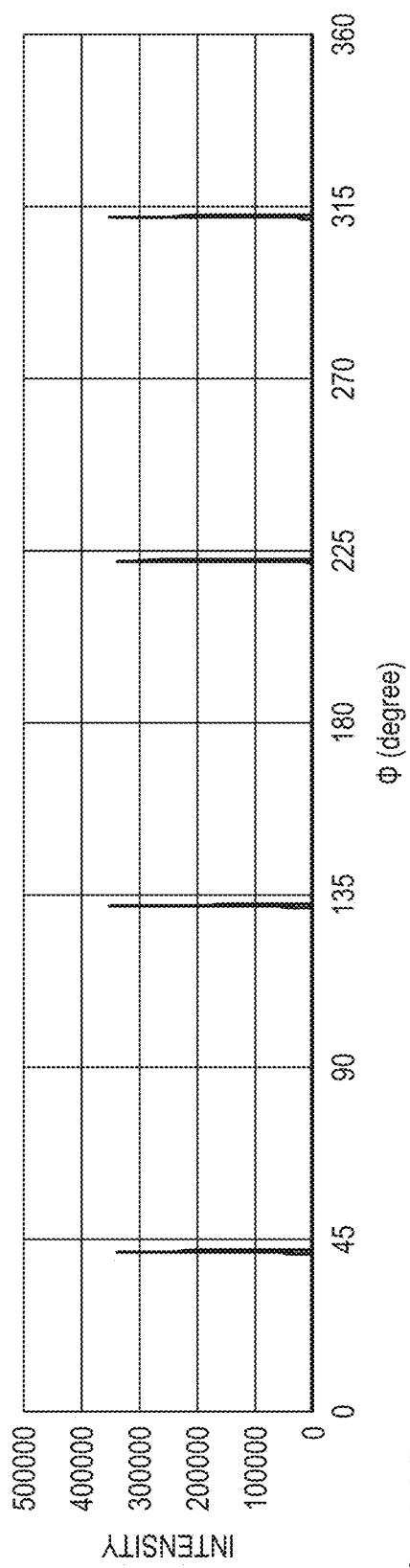
FIG. 23A shows the substrate 11 of the film structure 101 according to Example 4.
Figure 23B:
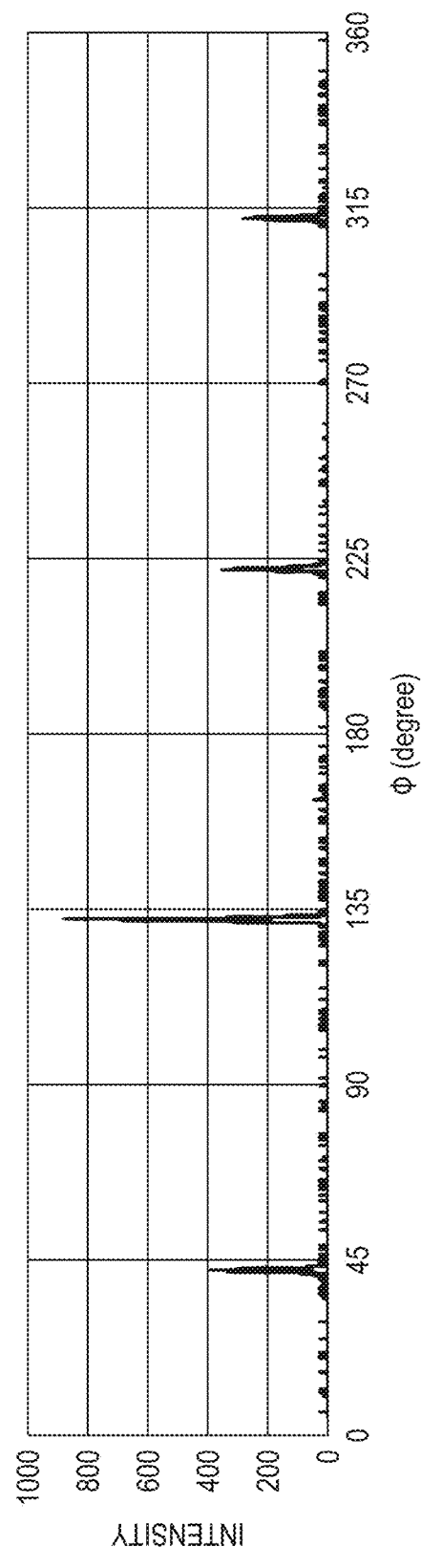
FIG. 23B shows an X-ray diffraction pattern obtained by φ scanning of the piezoelectric film 14 of the film structure 101 according to Example 4.

FIGS. 23A and 23B show X-ray diffraction patterns by φ scanning. FIG. 23A shows a pattern of the substrate 11, and FIG. 23B show a pattern formed up to the piezoelectric film body 14. As can be seen from FIG. 24, after the piezoelectric film 14 was formed, the piezoelectric film 14 had a four-fold symmetry axis at the same angle as that of the substrate 11, and the piezoelectric film 14 was formed by Cube-On-Cube.

Figure 24:
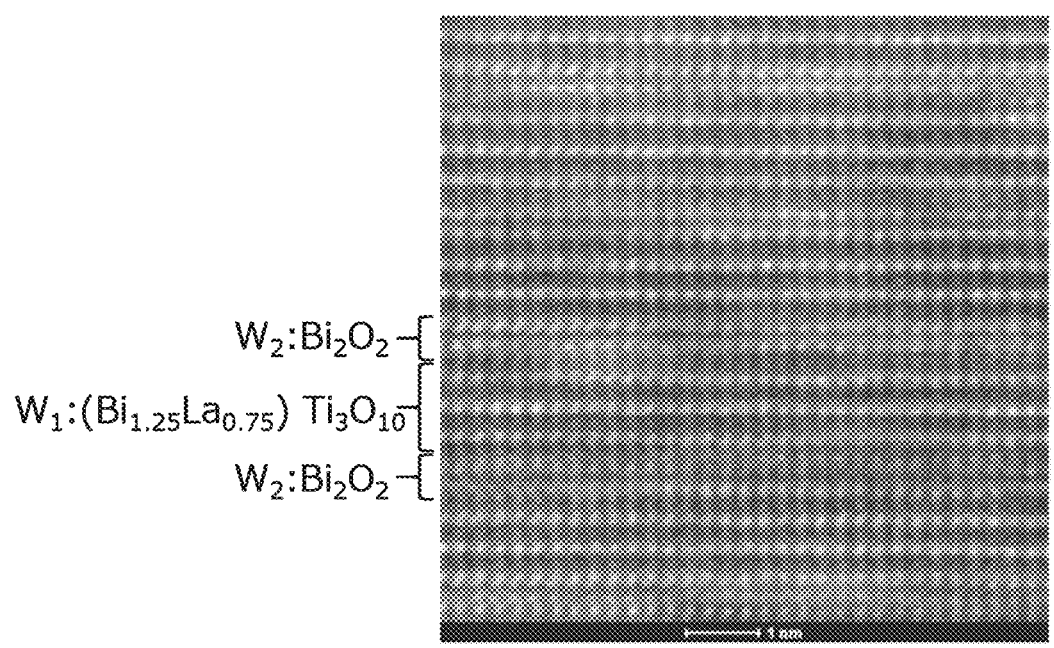
FIG. 24 shows a lattice image by STEM observing a cross section of BLT as the piezoelectric film 14 according to Example 4.
Figure 25:
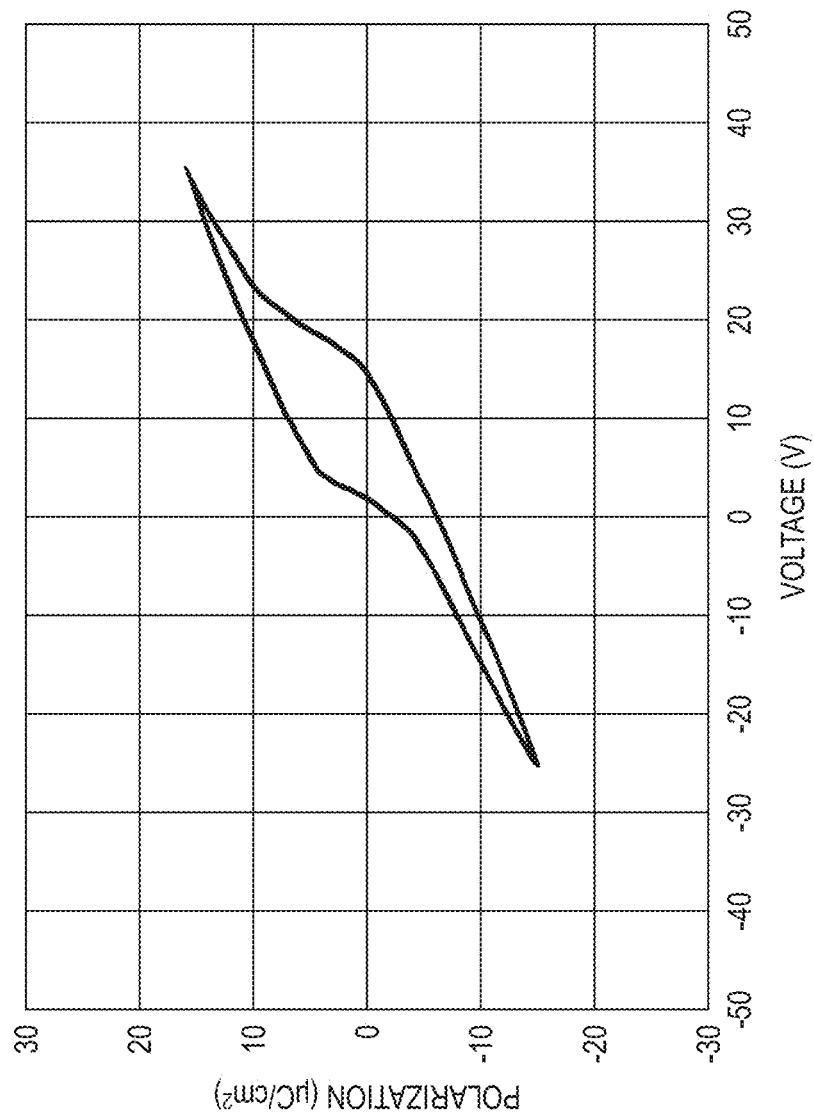
FIG. 25 is a diagram showing a voltage dependence of polarization of the piezoelectric film 14 according to Example 4.

FIG. 24 shows a lattice image by STEM observing BLT as the piezoelectric film 14 in a cross-section of the film structure 101. As shown in FIG. 24, it was confirmed that the piezoelectric film 14 was a single crystal without disturbance of crystal lattice such as transition. In FIG. 25, W1 is a perovskite layer, and W2 is a bismuth oxide layer.

FIG. 25 is a graph showing a voltage dependence of polarization of the piezoelectric film 14. As shown in FIG. 25, the piezoelectric film 14 according to Example 4 exhibited ferroelectricity, the residual polarization Pr was 4 $\mu C/cm^2$, and the coercive electric field Ec was 4.5 kV/cm.

Figure 26:
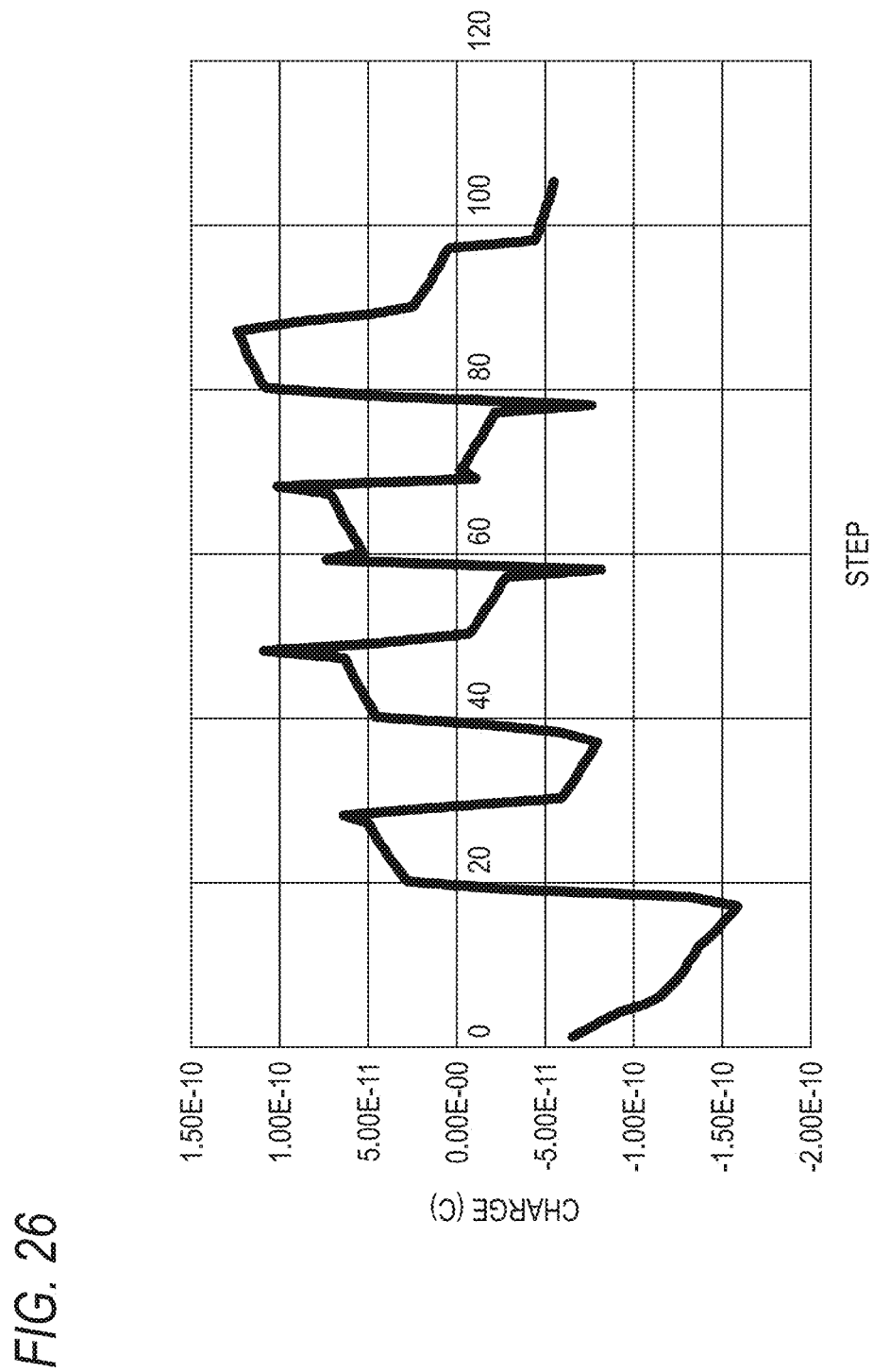
FIG. 26 is a diagram showing piezoelectricity of BLT as the piezoelectric film 14 according to Example 4.

FIG. 26 is a diagram showing a measurement result of the piezoelectric film 14 by a d33 meter. As shown in FIG. 26, it was found that the piezoelectric film 14 had piezoelectricity. A d33 value at this time was 164.7 (pC/N).

Example 5

In Example 5, a film was formed as Si/ZrO$_2$/Pt/SRO/PZT. Si(111) was used for the substrate 11. After PZT was formed as the piezoelectric film 14, a film thickness thereof was measured by XRF and found to be 1.0 μm. As a material of PZT, a target of Pb/Zr/Ti (130/52/48) was used.

Figure 27:
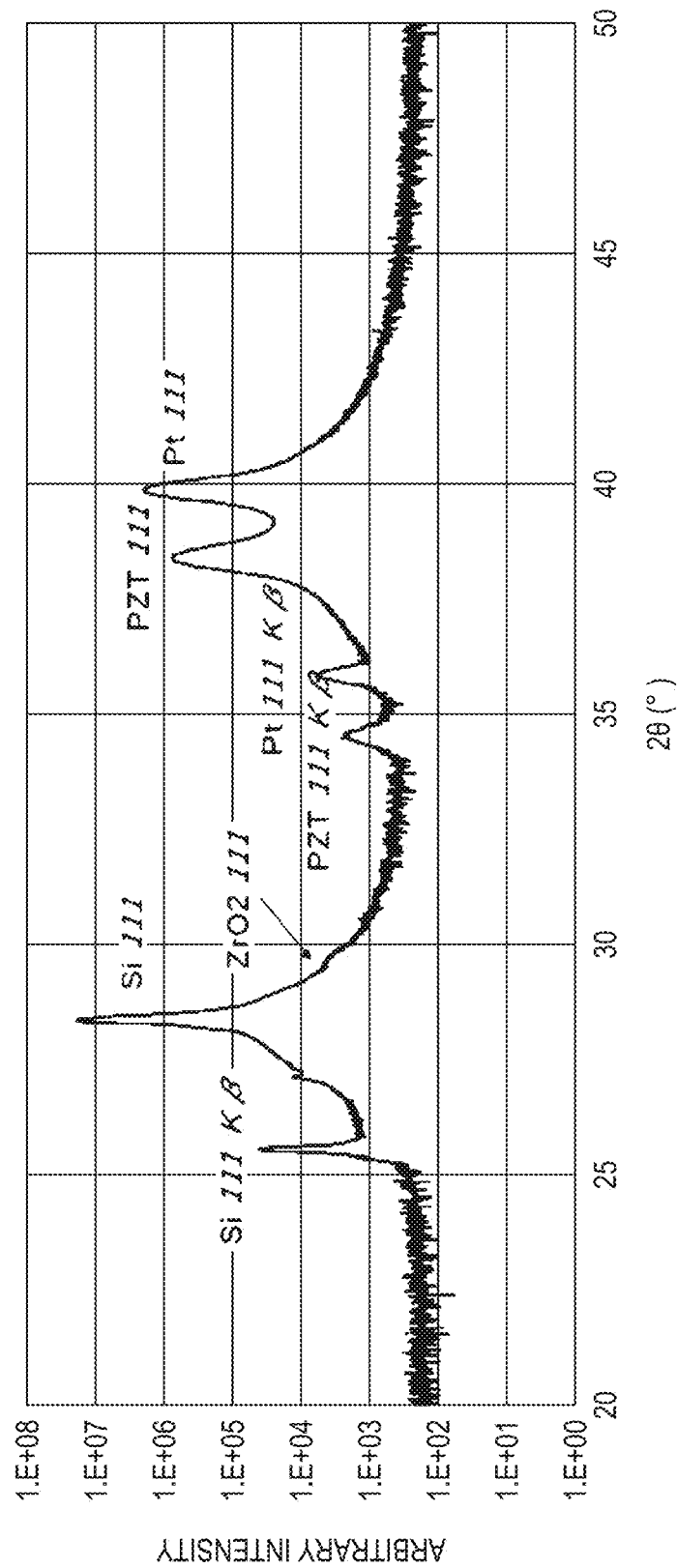
FIG. 27 shows a result of measuring a θ-2θ spectrum for the film structure 101 according to Example 5 by an XRD method.

FIG. 27 shows a result of measuring a θ-2θ spectrum for a sample prepared in Example 5 by an XRD method. As shown in FIG. 27, all of the substrate 11, the buffer film 12, the conductive film 13, and the piezoelectric film 14 were oriented in a (111) plane.

Figure 28:
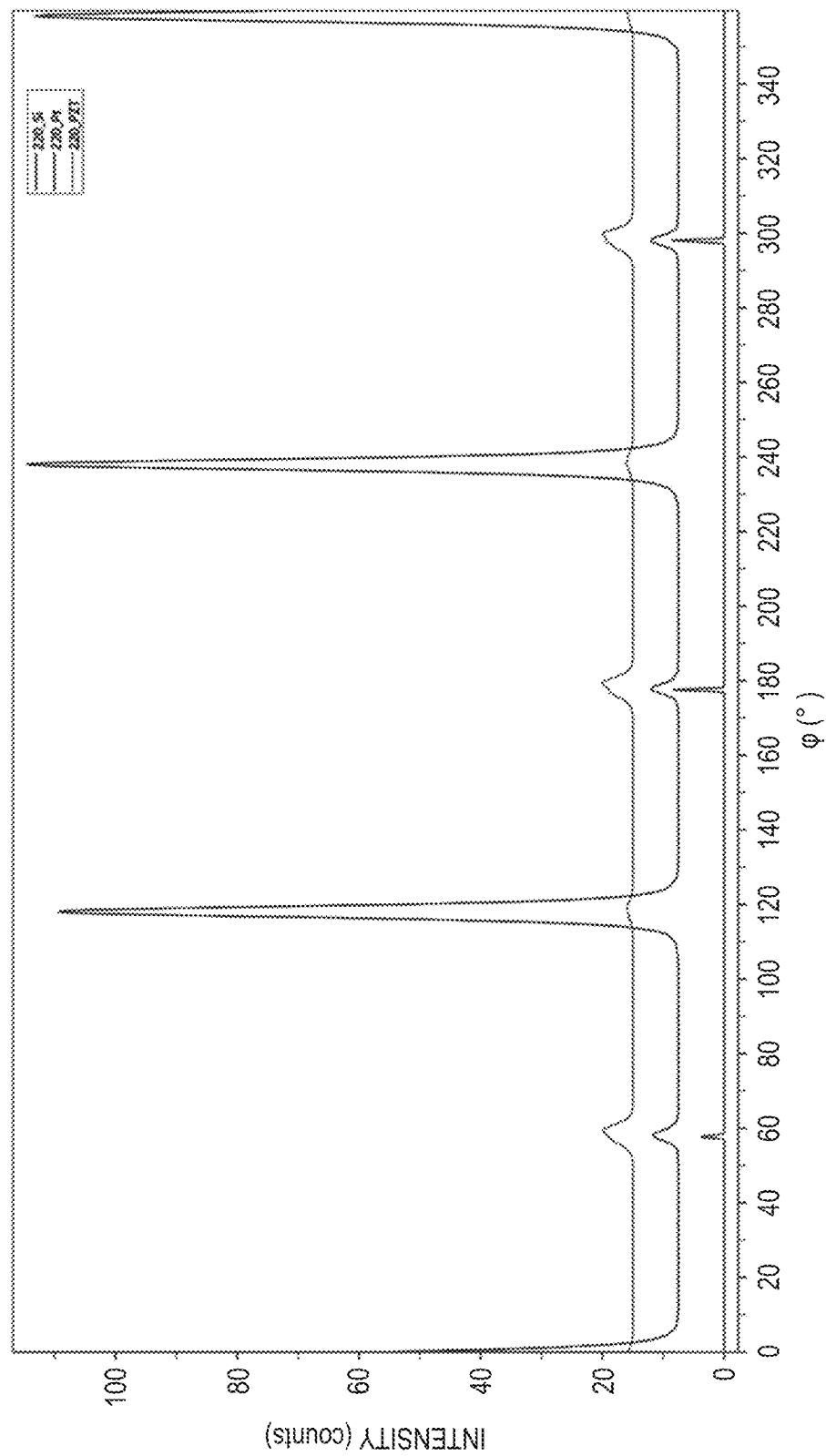
FIG. 28 is a diagram showing an X-ray diffraction pattern obtained by φ scanning of the film structure 101 according to Example 5.

FIG. 28 shows the result of φ scanning by an XRD method in which the (111) plane is measured as a diffraction plane for the sample prepared in Example 5. As shown in FIG. 28, the substrate 11, the conductive film 13, and the piezoelectric film 14 exhibited three-fold symmetry. Although a peak of the conductive film 13 is shifted by 60°, the conductive film 13 is a single crystal film formed by means of epitaxial growth, and the piezoelectric film 14 is also a single crystal film formed by epitaxial growth.

Example 6

In Example 6, a film was formed as Si/ZrO$_2$/Pt/SRO/PZT. Si(110) was used for the substrate 11. After PZT was formed as the piezoelectric film 14, a film thickness thereof was measured by XRF and found to be 1.0 μm. As a material of PZT, a target of Pb/Zr/Ti (130/52/48) was used.

Figure 29:
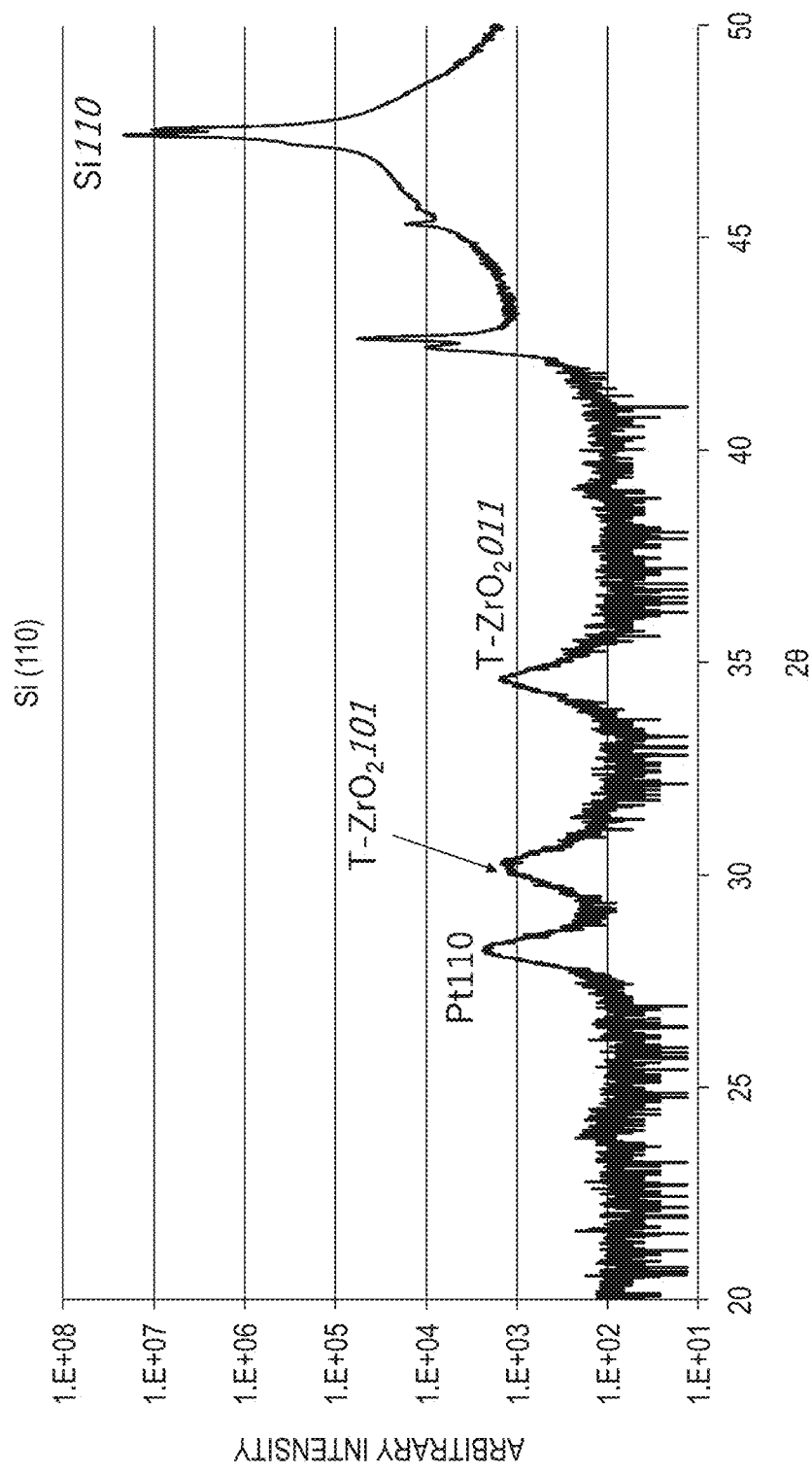
FIG. 29 shows a result of measuring a θ-2θ spectrum for the film structure 101 according to Example 6 by an XRD method.

FIG. 29 shows a result of measuring a θ-2θ spectrum for a sample prepared in Example 6 by an XRD method. As shown in FIG. 29, the substrate 11 and the conductive film 13 were preferentially oriented in a (110) plane.

Figure 30:
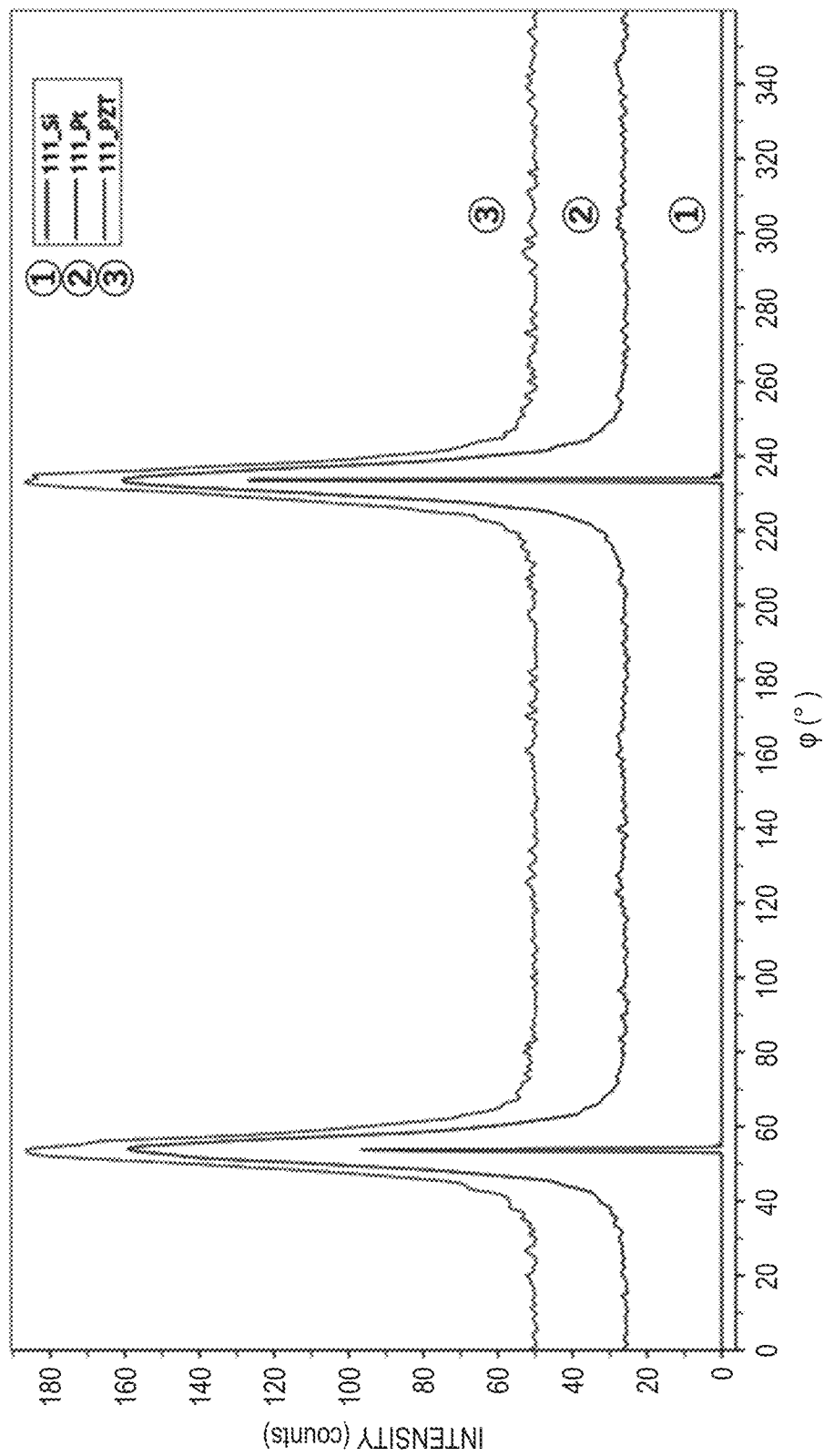
FIG. 30 is a diagram showing an X-ray diffraction pattern obtained by φ scanning of the film structure 101 according to Example 6.

FIG. 30 shows the result of φ scanning by an XRD method in which the (111) plane is measured as a diffraction plane for a sample prepared in Example 6. As shown in FIG. 30, the substrate 11, the conductive film 13, and the piezoelectric film 14 exhibited two-fold symmetry. Thus, it can be said that the piezoelectric film 14 is a single crystal film formed by means of epitaxial growth.

As can be seen from the results of Examples 1 to 6, the buffer film 12 is formed by means of epitaxial growth according to the orientation of the substrate 11, and various piezoelectric films 14 formed thereon are also formed by means of epitaxial growth. It is considered that this is because, after the buffer film 12 is formed, the crystal structure of the buffer film 12 changes according to the piezoelectric material formed thereon, as described below.

Figure 31A:
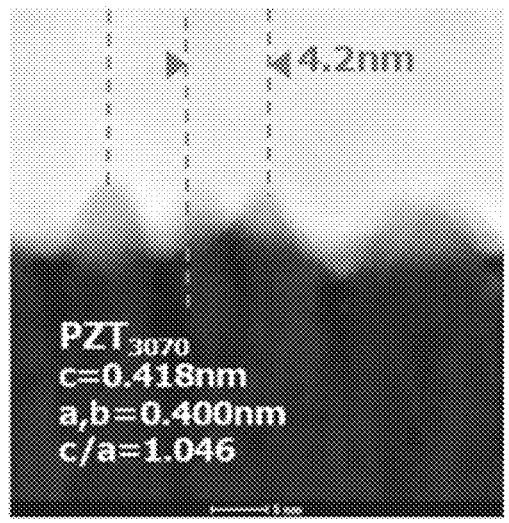
FIG. 31A shows a result of STEM observation of cross sections of the buffer film 12 and the conductive film 13 for a sample in which PZT (30/70) film is formed according to Example 1.
Figure 31B:
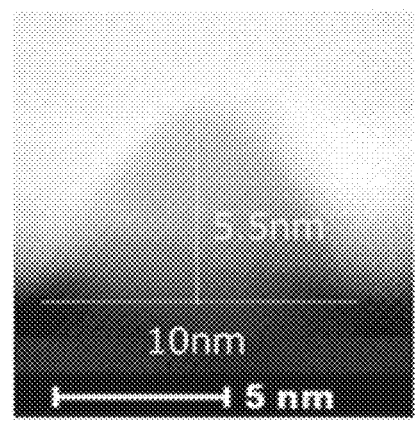
FIG. 31B shows a result of STEM observation of cross sections of the buffer film 12 and the conductive film 13 for a sample in which PZT (30/70) film is formed according to Example 1.

FIGS. 31A and 31B show results of STEM observation of cross sections of the buffer film 12 and the conductive film 13 for a sample in which PZT (30/70) according to Example 1 was formed. A length between the protruding portions 12b shown in FIG. 31A was 4.2 nm. FIG. 31B is an enlarged view of the protruding portion 12b.

Figure 32A:
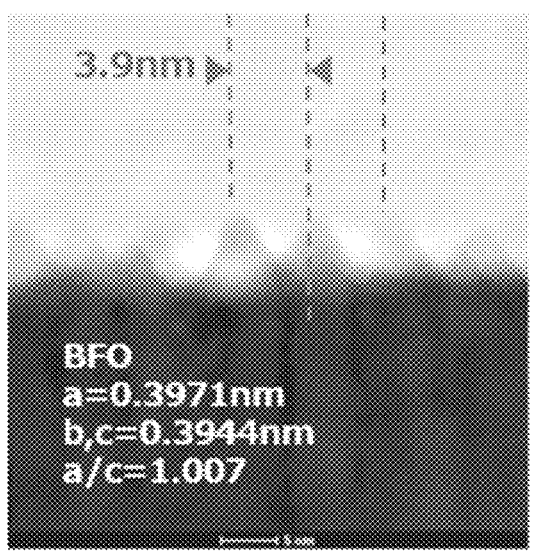
FIG. 32A shows a result of STEM observation of cross sections of the buffer film 12 and the conductive film 13 for a sample in which BFO film is formed according to Example 3.
Figure 32B:
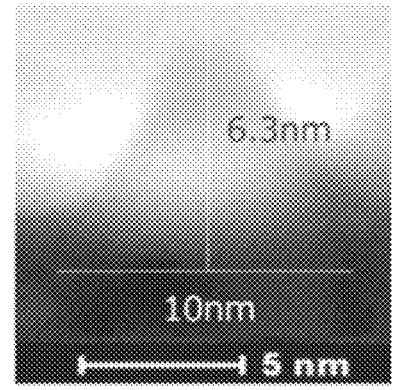
FIG. 32B shows a result of STEM observation of cross sections of the buffer film 12 and the conductive film 13 for a sample in which BFO film is formed according to Example 3.

FIGS. 32A and 32B show the results of STEM observation of the cross sections of the buffer film 12 and the conductive film 13 for the sample in which a BFO film according to Example 3 was formed. The length between the protruding portions 12b shown in FIG. 31A was 3.9 nm. FIG. 32B is an enlarged view of the protruding portion 12b.

Figure 33A:
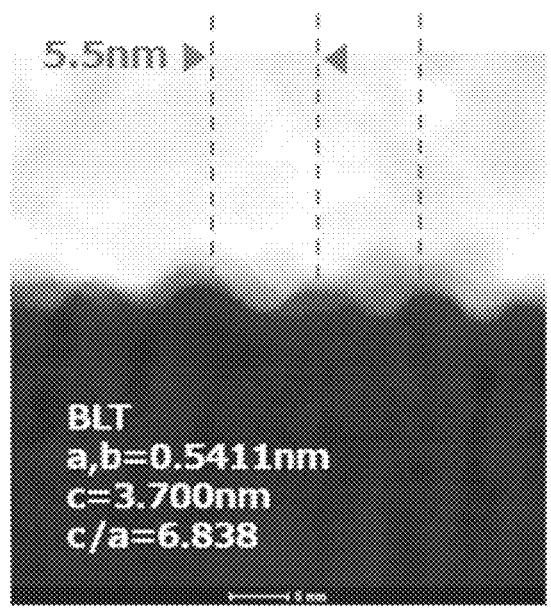
FIG. 33A shows a result of STEM observation of cross sections of the buffer film 12 and the conductive film 13 for a sample in which the BLT film is formed according to Example 4.
Figure 33B:
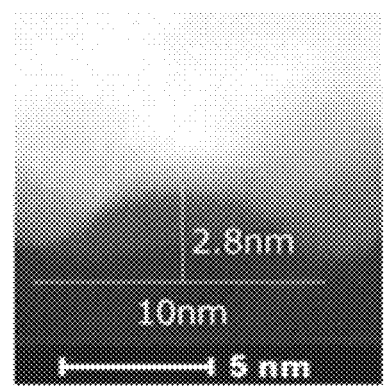
FIG. 33B shows a result of STEM observation of cross sections of the buffer film 12 and the conductive film 13 for a sample in which the BLT film is formed according to Example 4.

FIGS. 33A and 33B show results of STEM observation of the cross sections of the buffer film 12 and the conductive film 13 for a sample in which BLT according to Example 4 was formed. The length between the protruding portions 12b shown in FIG. 33A was 5.5 nm. FIG. 33B is an enlarged view of the protruding portion 12b.

As shown in FIGS. 31A to 33B, a height of the protruding portion 12b changes according to a lattice constant of the piezoelectric film 14. For example, the lattice constant of an a-axis of BFO shown in FIG. 32A is 0.3971 nm, which is the shortest as compared with PZT in FIG. 31A and BLT in FIG. 33A. At this time, a height of the protruding portion 12b shown in FIG. 32B is 6.3 nm, and it is considered that the protruding portion 12b extends upward in accordance with BFO having a short lattice constant in the film formation process of BFO which is the piezoelectric film 14.

On the other hand, the lattice constant of the a-axis of BLT shown in FIG. 33A is 0.5411 nm, which is the longest as compared with PZT in FIG. 31A and BFO in FIG. 32A. At this time, as shown in FIG. 33B, the height of the protruding portion 12b is 2.8 nm, and it is considered that the protruding portion 12b is crushed downward in accordance with BLT having the long lattice spacing in the film formation process of BLT which is the piezoelectric film 14.

In this way, the buffer film 12, in particular, the protruding portion 12b, is deformed according to the type of the piezoelectric film 14, and the lattice spacing of the conductive film 13 and the film 16 on the buffer film 12 also varies.

Figure 34A:
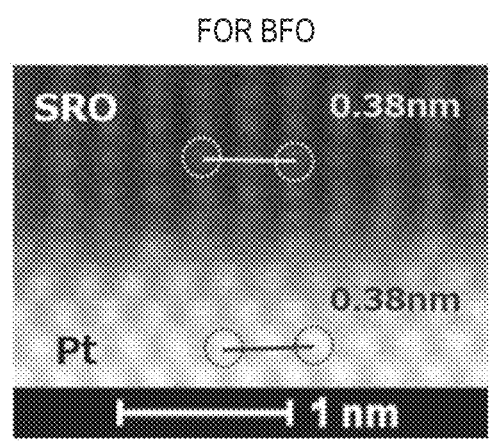
FIG. 34A is a lattice image showing a cross section of an interface between the conductive film 13 and a film 16 when BFO film is formed according to Example 3.
Figure 34B:
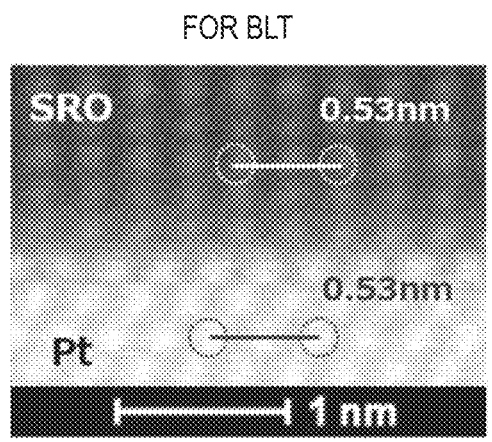
FIG. 34B is a lattice image showing a cross section of an interface between the conductive film 13 and the film 16 when BLT film is formed according to Example 4.

FIG. 34A is a lattice image showing a cross section of an interface between the conductive film 13 and the film 16 when the BFO film is formed, and FIG. 34B is a lattice image showing a cross section of an interface between the conductive film 13 and the film 16 when the BLT film is formed.

The molecular spacing between the conductive film 13 and the film 16 when BLT is formed as shown in FIG. 34B is longer than the molecular spacing between the conductive film 13 and the film 16 when BFO is formed as shown in FIG. 34A.

Example 7

In Example 7, a film was formed as Si/ZrO$_2$/Pt/SRO/AlN. Si(100) was used for the substrate 11. The manufacturing conditions up to an SRO film are the same as those of Examples 1 to 6. AlN was formed under the following conditions.

Apparatus: RF magnetron sputtering apparatus
Power: 200 W
Gas: Ar
Pressure: 0.5 Pa
Film formation time: 60 minutes
Substrate temperature: 200° C.

Figure 35:
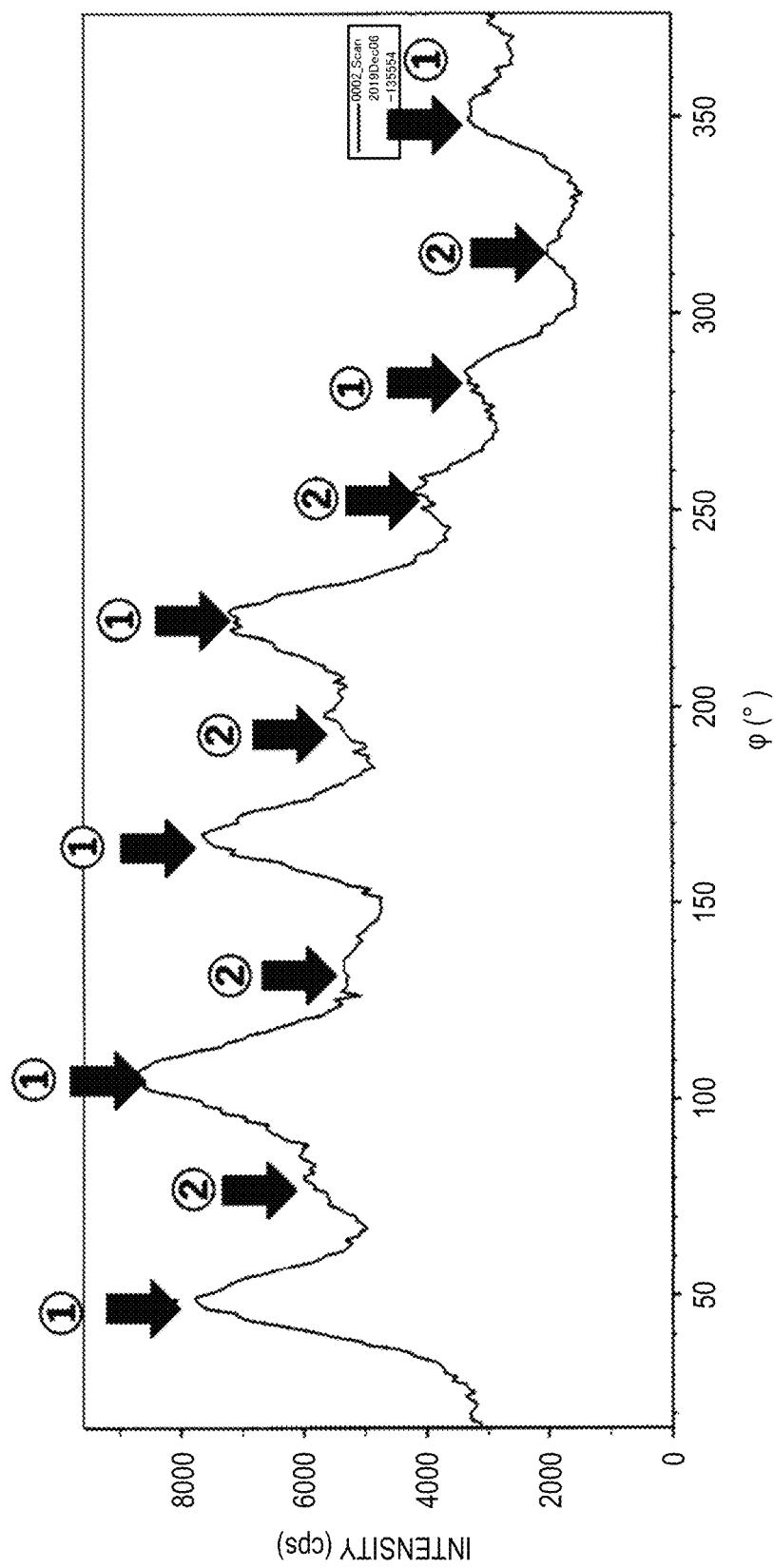
FIG. 35 shows a result of measuring an X-ray diffraction pattern obtained by φ-scanning AlN by an XRD method for the film structure 101 according to Example 7.

FIG. 35 shows a result of measuring an X-ray diffraction pattern obtained by φ-scanning AlN by an XRD method for the film structure 101 according to Example 7. As shown in FIG. 35, it was found that an AlN film exhibited six-fold symmetry, was uni-oriented to (0001), and was single-crystallized. Circled numerals 1 and 2 shown in FIG. 35 indicate a rotation of 90° in a plane.

Example 8

In Example 8, a film was formed as Si/ZrO$_2$/Pt/SRO/LiNbO$_3$(LN). Si(100) was used for the substrate 11. The manufacturing conditions up to an SRO film are the same as those of Examples 1 to 6. LN was formed under the following conditions.

Apparatus: RF magnetron sputtering apparatus
Power: 160 W
Gas: Ar/O$_2$ ratio 2%
Pressure: 0.8 Pa
Film formation time: 9 hours
Substrate temperature: 400° C.

Figure 36:
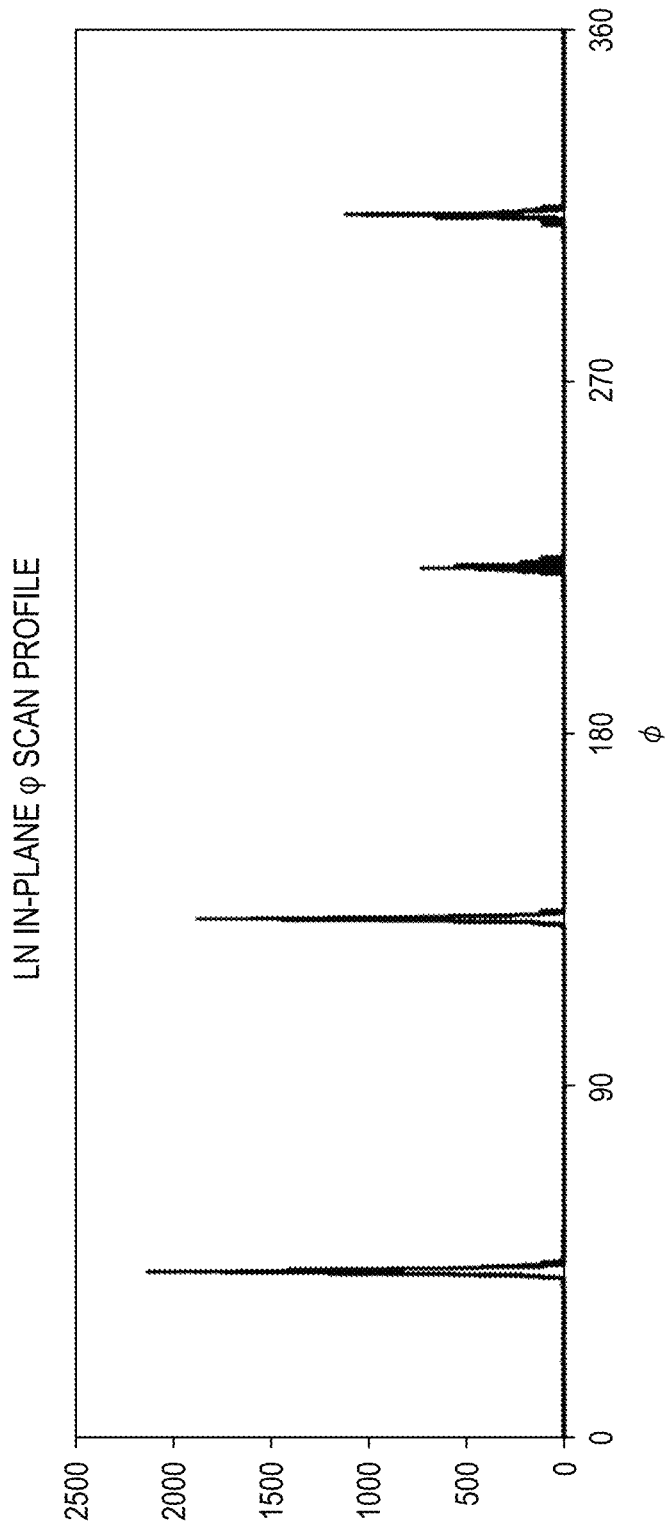
FIG. 36 shows a result of measuring an X-ray diffraction pattern obtained by φ-scanning LiNbO₃ by an XRD method for the film structure 101 according to Example 8.

FIG. 36 shows a result of measuring an X-ray diffraction pattern obtained by φ-scanning LN by an XRD method for the film structure 101 according to Example 8. As shown in FIG. 35, it was found that a LN film exhibited four-fold symmetry, was uni-oriented to (001), and was single-crystallized.

As can be seen from the results of Examples 1 to 8, when a Pt film and an SRO film are formed on a buffer film containing zirconium by means of epitaxial growth and a piezoelectric film is formed thereon, a single crystallized piezoelectric film is formed.

REFERENCE SIGNS LIST

11 Substrate
12 Buffer film
12a Film portion
12b Protruding portion
13, 15 Conductive film
14 Piezoelectric film/superconductor film
16 Film
101 Film structure body

The invention claimed is:

1. A film structure comprising:
 a substrate;
 a buffer film formed on the substrate, having a tetragonal crystal structure containing zirconia, and including a film portion and a protruding portion;
 a metal film containing a platinum group element and formed on the buffer film by means of epitaxial growth; and
 a film containing $Sr(Ti_{1-x}, Ru_x)O_3$ ($0 \leq x \leq 1$) and formed on the metal film by means of epitaxial growth.

2. The film structure according to claim 1, wherein the metal film has a thickness of 20 nm to 150 nm.

3. The film structure according to claim 1, wherein the buffer film further contains a rare earth element or an alkaline earth element.

4. The film structure according to claim 1, wherein a surface area of the buffer film is 1.30 to 1.60 times a surface area of a planar surface.

5. The film structure according to claim 1, wherein the substrate is oriented in a (100) plane, a (110) plane, or a (111) plane.

6. The film structure according to claim 1, wherein the buffer film is formed by means of epitaxial growth in accordance with an orientation of the substrate.

7. A single crystal piezoelectric film formed on the film according to claim 1.

8. The single crystal piezoelectric film according to claim 7, having a trigonal crystal structure or a hexagonal crystal structure.

9. The single crystal piezoelectric film according to claim 8, comprising a material of $BiFeO_3$, $LiNbO_3$, $LiTaO_3$, or AlN.

10. The single crystal piezoelectric film according to claim 7, having a tungsten bronze-type crystal structure.

11. The single crystal piezoelectric film according to claim 7, having a bismuth layered crystal structure.

12. The single crystal piezoelectric film according to claim 11, comprising a material of $Bi_4Ti_3O_{12}$ or $(Bi_{4-x}La_x)Ti_3O_{12}$ ($0 \leq x < 1$).

13. The single crystal piezoelectric film according to claim 7, comprising a perovskite-type oxide represented by $ABO_3$.

14. The single crystal piezoelectric film according to claim 7, comprising a material of lead zirconate titanate.

15. The single crystal piezoelectric film according to claim 14, wherein the material of lead zirconate titanate is $Pb(Zr_{0.3}, Ti_{0.7})O_3$.

16. A single crystal superconductor film formed on the film according to claim 1.

17. The single crystal superconductor film according to claim 16, which is a bismuth-based superconductor.

18. The single crystal superconductor film according to claim 17, comprising a material of $Bi_2SrCa_2Cu_3O_{10}$.

19. The single crystal superconductor film according to claim 16, which is an yttrium-based superconductor.

20. The single crystal superconductor film according to claim 19, wherein a material of the yttrium-based superconductor is $YBa_2Cu_3O_7$.

* * * * *